(12) United States Patent
Yamazaki et al.

(10) Patent No.: US 6,765,549 B1
(45) Date of Patent: Jul. 20, 2004

(54) ACTIVE MATRIX DISPLAY WITH PIXEL MEMORY

(75) Inventors: Shunpei Yamazaki, Tokyo (JP); Jun Koyama, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/707,054

(22) Filed: Nov. 6, 2000

(30) Foreign Application Priority Data

| Nov. 8, 1999 | (JP) | ............................................ 11-316935 |
| Nov. 29, 1999 | (JP) | ............................................ 11-337004 |

(51) Int. Cl.[7] .................................................. G09G 3/30
(52) U.S. Cl. ........................ 345/80; 345/76; 315/169.3
(58) Field of Search ..................... 345/76–81; 315/169.3

(56) References Cited

U.S. PATENT DOCUMENTS

| 4,773,738 | A | 9/1988 | Hayakawa et al. ...... 350/350 S |
| 5,091,722 | A | 2/1992 | Kitajima et al. ............ 340/784 |
| 5,200,846 | A | 4/1993 | Hiroki et al. .................. 359/57 |
| 5,225,823 | A | 7/1993 | Kanaly ......................... 340/793 |
| 5,349,366 | A | 9/1994 | Yamazaki et al. ............. 345/92 |
| 5,424,752 | A | 6/1995 | Yamazaki et al. ............. 345/92 |
| 5,471,225 | A | 11/1995 | Parks ............................ 345/98 |
| 5,479,283 | A | 12/1995 | Kaneko et al. ................ 359/79 |
| 5,600,169 | A | 2/1997 | Burgener et al. ........... 257/352 |
| 5,642,129 | A | 6/1997 | Zavracky et al. ............ 345/100 |
| 5,712,652 | A | 1/1998 | Sato et al. ..................... 345/90 |
| 5,798,746 | A | 8/1998 | Koyama ....................... 345/98 |
| 5,828,429 | A | 10/1998 | Takemura |
| 5,990,629 | A | 11/1999 | Yamada et al. ........... 315/169.3 |
| 6,023,308 | A | 2/2000 | Takemura |
| 6,194,837 | B1 * | 2/2001 | Ozawa ..................... 315/169.1 |
| 6,259,846 | B1 * | 7/2001 | Roach et al. ................ 385/123 |
| 6,274,887 | B1 | 8/2001 | Yamazaki et al. ............. 257/72 |
| 6,392,618 | B1 * | 5/2002 | Kimura ........................ 345/85 |

FOREIGN PATENT DOCUMENTS

| EP | 0 999 595 | 5/2000 | |
| JP | 4-350627 | 12/1992 | |
| JP | 6-102530 | 4/1994 | |
| JP | 08-194205 | * 7/1996 | ........... G02F/1/133 |
| JP | 10-092576 | 4/1998 | |
| JP | 10-247735 | 9/1998 | |
| JP | 10-312173 | 11/1998 | |
| JP | 2000-208777 | 7/2000 | |

OTHER PUBLICATIONS

Schenk, H. et al, "Polymers for Light Emitting Diodes," EuroDisplay '99, Proceedings of the 19th International Display Research Conference, Berlin, Germany, Sep. 6–9, 1999, pp. 37–37.

(List continued on next page.)

*Primary Examiner*—Bipin Shalwala
*Assistant Examiner*—Tom Sheng
(74) *Attorney, Agent, or Firm*—Cook, Alex, McFarron, Manzo, Cummings & Mehler, Ltd.

(57) ABSTRACT

A display device capable of preventing a reduction of an electric charge stored in a gate electrode of an EL driver TFT, reduction due to a leak current of a switching TFT, and capable of preventing a reduction of the brightness of light emitted by an EL element is provided. One region of a source region and a drain region of a switching TFT is connected to an input side of an SRAM, and an output side of the SRAM and a gate electrode of the EL driver TFT are connected. The SRAM stores an input digital data signal until the next digital data signal is input.

17 Claims, 21 Drawing Sheets

OTHER PUBLICATIONS

English abstract re Japanese Patent Application No. 10-092576, published Apr. 10, 1998.

English abstract re Japanese Patent Application No. 10-247735, published Sep. 14, 1998.

English translation re Japanese Patent Application No. JP 4-350627, published Dec. 4, 1992.

English translation re Japanese Patent Application No. JP 6-102530, published Apr. 15, 1994.

English abstract re Japanese Patent Application No. JP 10-214060, published Aug. 11, 1998.

English abstract re Japanese Patent Application No. JP 10-232649, published Sep. 2, 1998.

English translation re Japanese Patent Application No. JP 10-312173, published Nov. 24, 1998.

* cited by examiner

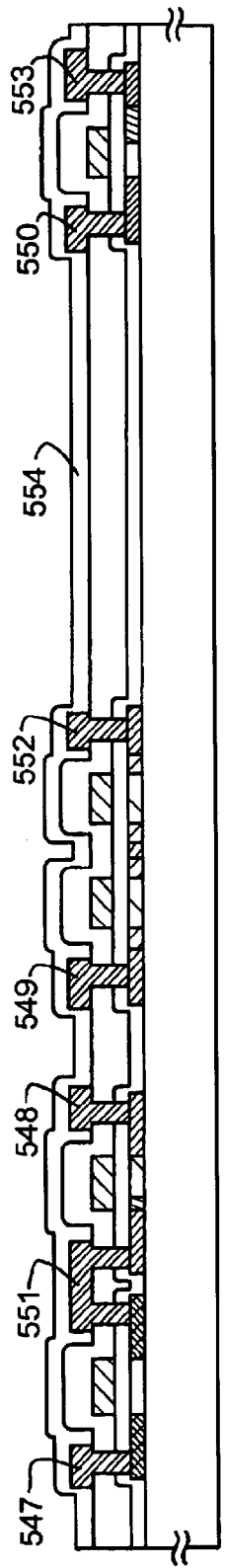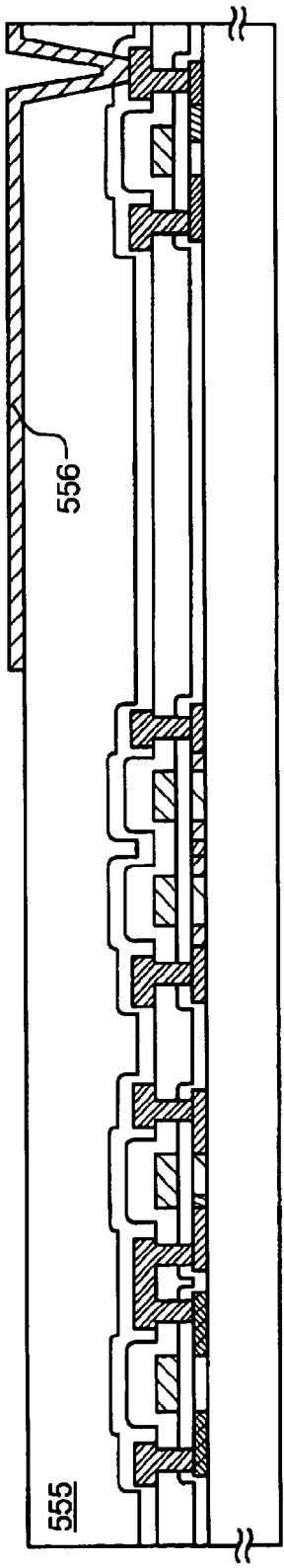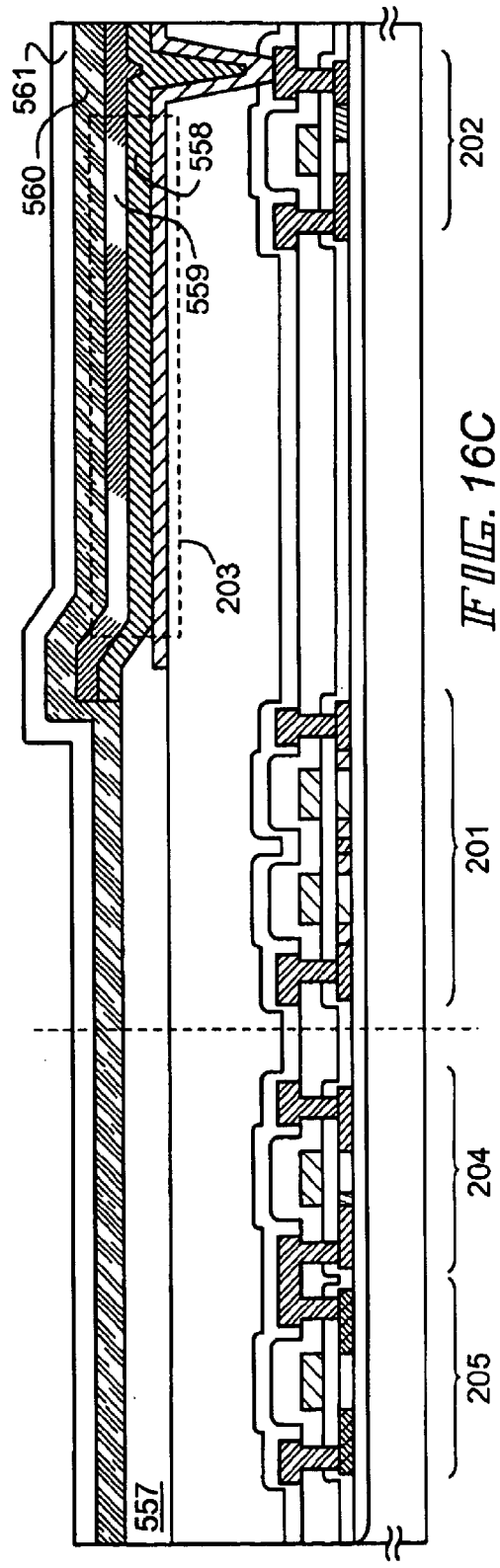

ACTIVE MATRIX DISPLAY WITH PIXEL MEMORY

BACKGROUND OF THE INVENTION

1. Field of the Invention

The present invention relates to an EL (electroluminescence) display formed by preparing an EL element on a substrate. More particularly, the invention relates to an EL display using a semiconductor element (an element using a semiconductor thin film). Furthermore, the present invention relates to an electronic device in which the EL display is used in a display portion thereof. The EL devices referred to in this specification may includes triplet-based light emission devices and/or singlet-based light emission devices.

2. Description of the Related Art

In recent years, technology for forming a TFT on a substrate has been largely improved, and an application development of the TFT to an active matrix type display device has been carried out. In particular, the TFT using a polysilicon film has a higher electric field effect mobility than the TFT using a conventional amorphous silicon film, and therefore, the TFT may be operated at a high speed. Thus, the pixel control which has been conducted at a driver circuit outside of the substrate may be conducted at the driver circuit which is formed on the same substrate as the pixel.

Such an active matrix type display device can, by preparing various circuits and elements on the same substrate, obtain various advantages such as a decrease in the manufacturing cost, a decrease in the size of the display device, an increase in the yield, and a decrease in the throughput.

Further, research on the active matrix type EL display having an EL element as a self-light-emitting device (hereafter referred to as an EL display) is becoming more and more active. The EL display is referred to as an organic EL display (OELD) or an organic light-emitting diode (OLED).

The EL display is a self-light-emitting type unlike a liquid crystal display device. The EL element is constituted in such a manner that an EL layer is sandwiched between a pair of electrodes. However, the EL layer normally has a lamination structure. Typically, the lamination structure of a "positive hole transport layer/a luminous layer/an electron transport layer" proposed by Tang et al. of the Eastman Kodak Company can be cited. This structure has a very high light-emitting efficiency, and this structure is adopted in almost all the EL displays which are currently subjected to research and development.

In addition, the structure may be such that on the pixel electrode, a positive hole injection layer/a positive hole transport layer/a luminous layer/an electron transport layer, or a positive hole injection layer/a positive hole transport layer/a luminous layer/an electron transport layer/an electron injection layer may be laminated in order. Phosphorescent dye or the like may be doped into the luminous layer.

In this specification, all the layers provided between the pixel electrode and an opposite electrode are generally referred to as EL layers. Consequently, the positive hole injection layer, the positive hole transport layer, the luminous layer, the electron transport layer, the electron injection layer and the like are all included in the EL layers.

Then, a predetermined voltage is applied to the EL layer having the above structure from the pair of the electrodes, so that a recombination of carriers is generated in the luminous layer and light is emitted. Incidentally, in this specification, the fact that the EL element emits a light is described as the fact that the EL element is driven. Furthermore, in this specification, the light-emitting element formed of the anode, the EL layer and the cathode is referred to as an EL element.

Conventionally, the pixel structure of an active matrix type EL display device has generally been like that shown in FIG. 18. Reference numeral 1701 in FIG. 18 denotes a TFT functioning as a switching element (hereafter referred to as a switching TFT), reference numeral 1702 denotes a TFT functioning as an element for controlling the electric current supplied to an EL element 1703 (hereafter referred to as an EL driver TFT), reference numeral 1703 denotes the EL element, and reference numeral 1704 denotes a capacitor (storage capacitor).

Gate signal lines (G1 to Gy) for inputting gate signals are connected to gate electrodes of the switching TFTs 1701 of each pixel. Further, one set of regions of source regions and drain regions of the switching TFTs 1701 of each pixel are connected to source signal lines, also referred to as data signal lines (S1 to Sx) for inputting digital data signals, and the other set of regions is connected to gate electrodes of the EL driver TFTs 1702 of each pixel and to the capacitors 1704 of each pixel, respectively. Note that the digital data signal refers to a digital video signal.

One of the source regions of the EL driver TFTs 1702 of each pixel is connected to one of electric power supply lines (V1 to Vx), and the drain region is connected to the EL element 1703. The electric potential of the electric power supply lines (V1 to Vx) is referred to as an electric power supply potential. Further, the electric power supply lines (V1 to Vx) are connected to the capacitor 1704 of each pixel.

The EL element 1703 is composed of an anode, a cathode, and an EL layer formed between the anode and the cathode. When the anode is connected to the drain region of the EL driver TFT 1702, namely when the anode is a pixel electrode, the cathode becomes an opposing electrode. Conversely, when the cathode is connected to the drain region of the EL driver TFT 1702, namely when the cathode is the pixel electrode, the anode becomes the opposing electrode. The electric potential of the opposing electrode is referred to as an opposing electric potential throughout this specification. The electric potential difference between the electric potential of the opposing electrode and the electric potential of the pixel electrode is an EL driver voltage, and the EL driver voltage is applied to the EL layer.

A conventional method of driving an EL display is explained next. First, all of the switching TFTs 1701 having their gate electrode connected to the signal line G1 turn on in accordance with a gate signal input to the gate signal line G1. Note that the fact that all of the switching TFTs having their gate electrode connected to the signal line turn on in accordance with the gate signal is referred to as a gate signal line selection in this specification.

The digital data signal is then input into the source signal lines (S1 to Sx) in order. The opposing electric potential is maintained at the same level as the electric power supply potential of the electric power supply lines (V1 to Vx). The digital data signal has "0" or "1" information, and the "0" and "1" digital data signals specify signals having either high or low voltage.

The digital data signal input to the source signal lines (S1 to Sx) is then input to the gate electrode of the EL driver TFT 1702 through the on-state switching TFT 1701. Further, the digital data signal is also input to the capacitor 1704 and stored.

The gate signal lines G2 to Gy are then selected in order in accordance with the gate signal, and the above operations are repeated. Note that the input of the digital data signal to the gate electrode of the EL driver TFT through the switching TFT is referred to as inputting the digital data signal to the pixel throughout this specification. A period until the digital data signal is input to all of the pixels is referred to as a write-in period.

When the digital data signal is input to all of the pixels, all of the switching TFTs 1701 are turned off. The opposing electric potential is then given an electric potential difference to the electric power supply potential at a level in which the EL elements emit light. The digital data signal stored in the capacitor 1704 is then input to the gate electrode of the EL driver TFT 1702.

When the digital data signal has "0" information, the EL driver TFT 1702 is set to the off state and the EL element 1703 does not emit light. Conversely, when the digital data signal contains "1" information, the EL driver TFT 1702 turns on. As a result, the pixel electrode of the EL element 1703 is maintained at the electric power supply potential, and the EL element 1703 emits light. Thus in accordance with the information of the digital data signal, the selection of whether the EL element emits light or does not emit light is made and display is performed for all pixels at the same time. By performing display of all of the pixels, an image is formed. A period in which the pixels perform display is referred to as a display period.

The digital data signal is thus input to all of the pixels in the digital drive EL display during the write-in period. The input digital data signal is then stored in each pixel, and when the write-in period is complete, the display period begins and all of the pixels perform display at the same time.

With the above driver method, a time difference develops for the storage of the digital data signal between the pixel into which the digital data signal is first written into, and the last pixel into which the digital data signal is written into, within the write-in period.

The digital data signal is ideally stored as an electric charge in the gate electrode of the EL driver TFT when the switching TFT is in the off state. However, in practice, the electric charge gradually decreases due to a leak current caused by an off current of the switching TFT (a drain current which flows even when the TFT, as a switch, is in the off state). The reduction in the electric charge due to the leak current occurs easier the longer the electric charge storage time becomes. Therefore, the nearer the beginning of the write-in period that the digital signal is written into the pixel, the more that the electric charge stored in the gate electrode of the EL driver TFT will tend to decrease.

It is necessary to store the electric charge of the EL driver TFT gate electrode from when the digital data signal is input in the write-in period until the display period is complete. If the electric charge stored in the gate electrode of the EL driver TFT decreases, then the brightness of light emitted by the EL element will fall, and a desired gradation will not be obtained. Even if a digital data signal for preforming display having the same brightness is input to each pixel, display having the same brightness is not obtained for the first pixel into which the digital data signal is written and for the last pixel into which the digital data signal is written.

By connecting the gate electrode of the EL driver TFT to a storage capacitor, it is possible to supplement, to a certain degree, the electric charge of the gate electrode which decreases due to the leak current. However, the electric charge which accumulates in the storage capacitor is also reduced by the leak current. There are times, therefore, when the reduction in electric charge stored in the EL driver TFT gate electrode is not sufficiently supplemented, and the brightness of the light emitted by the EL elements is reduced.

SUMMARY OF THE INVENTION

An object of the present invention is to provide means for resolving the above types of problems. Namely, an object of the present invention is to prevent a reduction of an electric charge, stored in a gate electrode of an EL driver TFT, by a leak current of a switching TFT, and to prevent a decrease in the brightness of light emitted by an EL element.

As means for fulfilling the above objects, a volatile memory SRAM is formed in the present invention between the gate electrode of the EL driver TFT and, from among a source region and a drain region of the switching TFT, the region which is not connected to a source signal line. Differing from a DRAM (dynamic random access memory), the SRAM (static random access memory) is not limited by removing an electric power supply, but rather stores input data until the next data is input. Further, compared to the DRAM, the amount of time needed to input the data is shorter with the SRAM, and it is possible to perform high speed write-in of data.

It becomes possible to store a digital data signal input to a pixel during a write-in period, until a display period is complete, with the above structure. In other words, it becomes possible to prevent the electric charge stored in the gate electrode of the EL driver TFT from being reduced by the leak current of the switching TFT, and it becomes possible to prevent the brightness of the light emitted by the EL element from falling.

Note that it is possible to form the volatile memory using a TFT, and therefore it is possible to form the volatile memory at the same time as the switching TFT and the EL driver TFT.

Note that a storage capacitor need not be actively formed in the present invention. If the storage capacitor is not formed, it becomes possible to shorten the amount of time for inputting the digital data signal to the pixels. Therefore, even if there is an increase in the number of EL display pixels, the amount of write-in time can be controlled.

The structure of the present invention is shown below.

According to the present invention, there is provided an electro-optical device comprising a plurality of source signal lines, a plurality of gate signal lines, a plurality of electric power supply lines, and a plurality of pixels, characterized in that:

the plurality of pixels are each composed of a switching TFT, an SRAM, an EL driver TFT, and an EL element;

one of a source region and a drain region of the switching TFT is connected to one of the plurality of source signal lines, and one of the source region and the drain region of the switching TFT is connected to an input side of the SRAM, respectively;

an output side of the SRAM and a gate electrode of the EL driver TFT are connected;

the source region of the EL driver TFT is connected to one of the plurality of electric power supply lines, and the drain region of the EL driver TFT is connected to a cathode or an anode of the EL element, respectively; and the SRAM stores a digital data signal input to the SRAM from one of the plurality of source signal lines, through the switching TFT, until the next digital data signal is input to the SRAM.

According to the present invention, there is provided an electro-optical device comprising a plurality of source signal lines, a plurality of gate signal lines, a plurality of electric power supply lines, and a plurality of pixels, characterized in that:

the plurality of pixels are each composed of a switching TFT, an SRAM, an EL driver TFT, and an EL element;

one of a source region and a drain region of the switching TFT is connected to one of the plurality of source signal lines, and one of the source region and the drain region of the switching TFT is connected to an input side of the SRAM, respectively;

an output side of the SRAM and a gate electrode of the EL driver TFT are connected;

the source region of the EL driver TFT is connected to one of the plurality of electric power supply lines, and the drain region of the EL driver TFT is connected to a cathode or an anode of the EL element;

a period within one frame period during which the EL element emits light is controlled by using a digital data signal; and the SRAM stores the digital data signal input to the SRAM from one of the plurality of source signal lines, through the switching TFT, until the next digital data signal is input to the SRAM.

According to the present invention, there is provided an electro-optical device comprising a plurality of source signal lines, a plurality of gate signal lines, a plurality of electric power supply lines, and a plurality of pixels, characterized in that:

the plurality of pixels are each composed of a switching TFT, an SRAM, an EL driver TFT, and an EL element;

one of a source region and a drain region of the switching TFT is connected to one of the plurality of source signal lines, and one of the source region and the drain region of the switching TFT is connected to an input side of the SRAM;

an output side of the SRAM and a gate electrode of the EL driver TFT are connected;

the source region of the EL driver TFT is connected to one of the plurality of electric power supply lines, and the drain region of the EL driver TFT is connected to a cathode or an anode of the EL element;

one frame period is divided into n sub-frame periods SF1, SF2, . . . , SFn;

the n sub-frame periods SF1, SF2, . . . , SFn have write-in periods Ta1, Ta2, . . . , Tan, and display periods Ts1, Ts2, . . . , Tsn, respectively;

a digital data signal is input to all of the plurality of pixels during the write-in periods Ta1, Ta2, . . . , Tan;

whether the plurality of EL elements emit light or do not emit light during the display periods Ts1, Ts2, . . . , Tsn is selected in accordance with the digital data signal;

a ratio of the length of the display periods Ts1, Ts2, . . . , Tsn is expressed by $2^{0} :: 2^{-1} :: \ldots 2^{-(n-1)}$; and the SRAM stores the digital data signal input to the SRAM from one of the plurality of source signal lines, through the switching TFT, until the next digital data signal is input to the SRAM.

The present invention may have a characteristic in that the SRAM has two n-channel TFTs and two p-channel TFTs.

The present invention may have a characteristic in that:

source regions of the two p-channel TFTs of the SRAM are connected to a high voltage side of an electric power supply, and source regions of the two n-channel TFTs are connected to a low voltage side of the electric power supply;

one p-channel TFT and one n-channel TFT form a pair;

the drain regions of the p-channel TFT and n-channel TFT pairs are mutually connected;

the gate electrodes of the p-channel TFT and n-channel TFT pairs are mutually connected;

the drain regions of one p-channel TFT and n-channel TFT pair are maintained at the same electric potential as that of the gate electrodes of the other p-channel TFT and n-channel TFT pair; and the drain regions of one p-channel TFT and n-channel TFT pair are an input side for inputting the digital data signal, and the drain regions of the other p-channel TFT and n-channel TFT pair are an output side for outputting a signal in which the polarity of the input digital data signal is inverted.

The present invention may have a characteristic in that the SRAM has two n-channel TFTs and two resistors.

The present invention may have a characteristic in that:

drain regions of the two n-channel TFTs of the SRAM are connected to a high voltage side of an electric power supply, and source regions of the two n-channel TFTs of the SRAM are connected to a low voltage side of the electric power supply through one of the two resistors;

the drain regions each of the two n-channel TFTs are mutually maintained at the same electric potential as a gate electrode of the other n-channel TFT; and from among the two n-channel TFTs, the drain region of one n-channel TFT is an input side for inputting the digital signal, and the drain region of the other n-channel TFT is an output side for outputting a signal in which the polarity of the input digital data signal is inverted.

The present invention may have a characteristic in that:

the plurality of EL elements have an EL layer between the anode and the cathode; and the EL layer is a low molecular weight organic material or an organic polymer material.

The present invention may have a characteristic in that the low molecular weight material is composed of $Alq_3$ (tris-8-quinolinolate aluminum) or TPD (triphenylamine dielectric).

The present invention may have a characteristic in that the organic polymer material is composed of PPV (polyphenylene vinylene), PVK (polyvinyl carbazole), or polycarbonate.

The first frame period may be equal to or less than 1/60 second.

The present invention may be a computer, a video, or a DVD, which is characterized by using the electro-optical device.

BRIEF DESCRIPTION OF THE DRAWINGS

In the accompanying drawings:

FIG. 16A to 16C are diagrams showing the process of manufacturing the EL display device of the present invention;

DETAILED DESCRIPTION OF THE PREFERRED EMBODIMENTS

Embodiment Mode of the Invention

Figure 1:
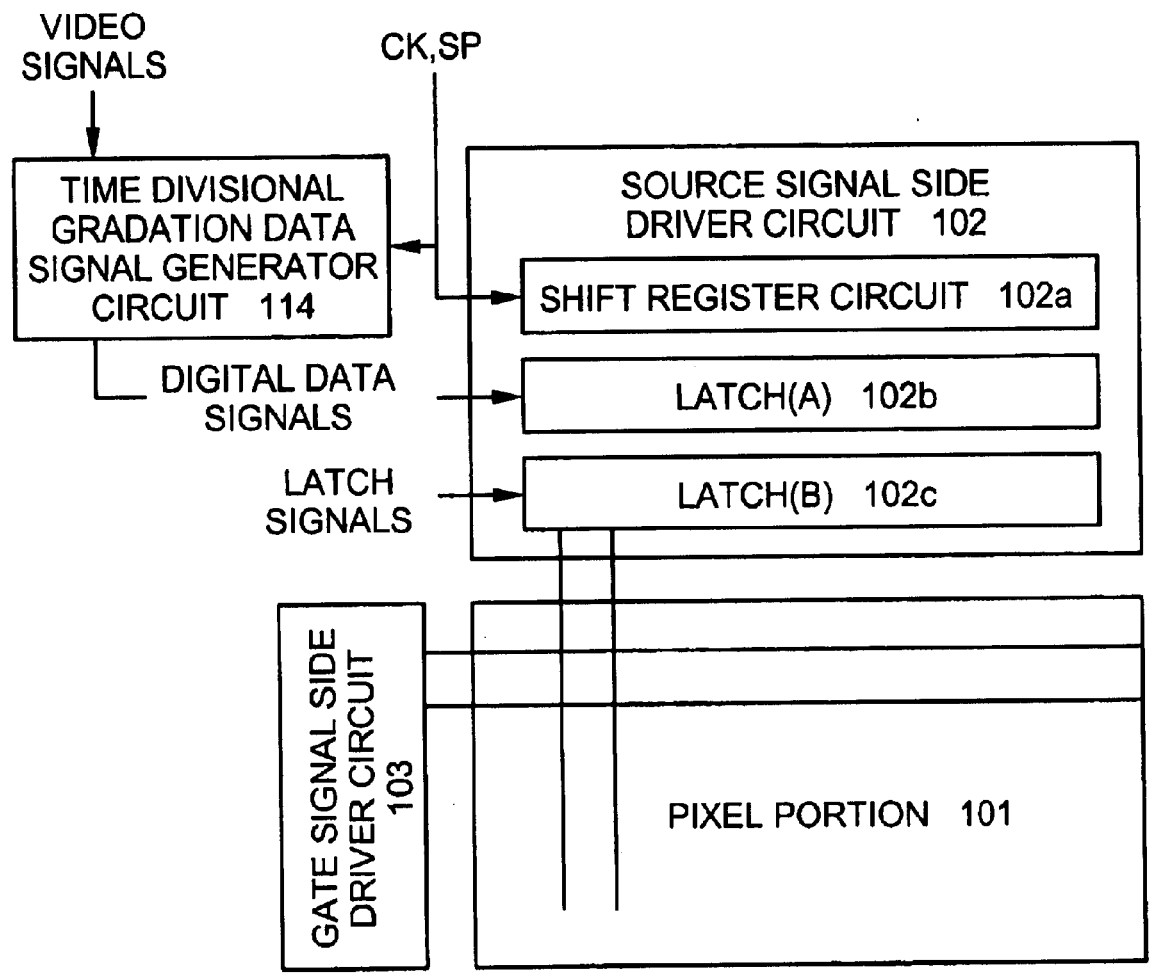
FIG. 1 is a diagram showing a circuit structure of an EL display of the present invention.

A block diagram of an EL display of the present invention is shown in FIG. 1. The EL display of FIG. 1 has a pixel portion 101 composed of TFTs formed on a substrate, a source signal side driver circuit 102 and a gate signal side driver circuit 103 arranged in the periphery of the pixel portion. Note that the EL display has one each of the source signal side driver circuit and the gate signal side driver circuit in this embodiment mode, but two source signal side driver circuits may also be used in the present invention. Further, two gate signal side driver circuits may also be used.

The source signal side driver circuit 102 fundamentally contains a shift register 102a, a latch (A) 102b, and a latch (B) 102c. Further, clock signals CK and start pulses SP are input to the shift register 102a, digital data signals are input to the latch (A) 102b, and latch signals are input to the latch (B) 102c.

In addition, although not shown in the figure, the gate signal side driver circuit 103 has a shift register and a buffer. A multiplexer may also be formed on the output side of the buffer.

The digital data signal input to the pixel portion is formed by a time partitioning gradation data signal generation circuit 114. An analog signal or digital signal video signal (a signal containing image information) is converted into a digital data signal for performing time gradation in the time partitioning gradation data signal generation circuit. At the same time, timing pulses necessary for performing time gradation display are generated in this circuit.

Specifically, the time partitioning gradation data signal generation circuit 114 contains means for: partitioning one frame period into a plurality of subframe periods corresponding to n-bit (where n is an integer equal to or greater than 2) gradations; selecting write-in periods and display periods in the plurality of subframe periods; and setting the length of the display periods.

The time partitioning gradation data signal generation circuit 114 may be formed externally to the EL display of the present invention. In this case, it becomes a structure in which the digital data signals formed externally are input to the EL display of the present invention. Electronic equipment (an electronic display device) having the EL display of the present invention as a display will then contain the EL display of the present invention and the time partitioning gradation data signal generation circuit as separate components.

Further, the time partitioning gradation data signal generation circuit 114 may also be implemented in the EL display of the present invention in a form such as an IC chip. In this case, it becomes a structure in which the digital data signals formed by the IC chip are input to the EL display of the present invention. Electronic equipment having the EL display of the present invention as a display contains the EL display of the present invention, in which the IC containing the time partitioning gradation data signal generation circuit is implemented, as a component.

Furthermore, the time partitioning gradation data signal generation circuit 114 may be formed by TFTs on the same substrate as that on which the pixel portion 101, the source signal side driver circuit 102, and the gate signal side driver circuit 103 are formed. In this case, provided that the video signal containing image information is input to the EL display, all processing can be performed on the substrate. The time partitioning gradation data signal generation circuit may be formed by TFTs having a polysilicon film as an active layer. Further, the time partitioning gradation data signal generation circuit is built into the EL display itself for electronic equipment having the EL display of the present invention as a display, and it is possible to miniaturize the electronic equipment.

Figure 2:
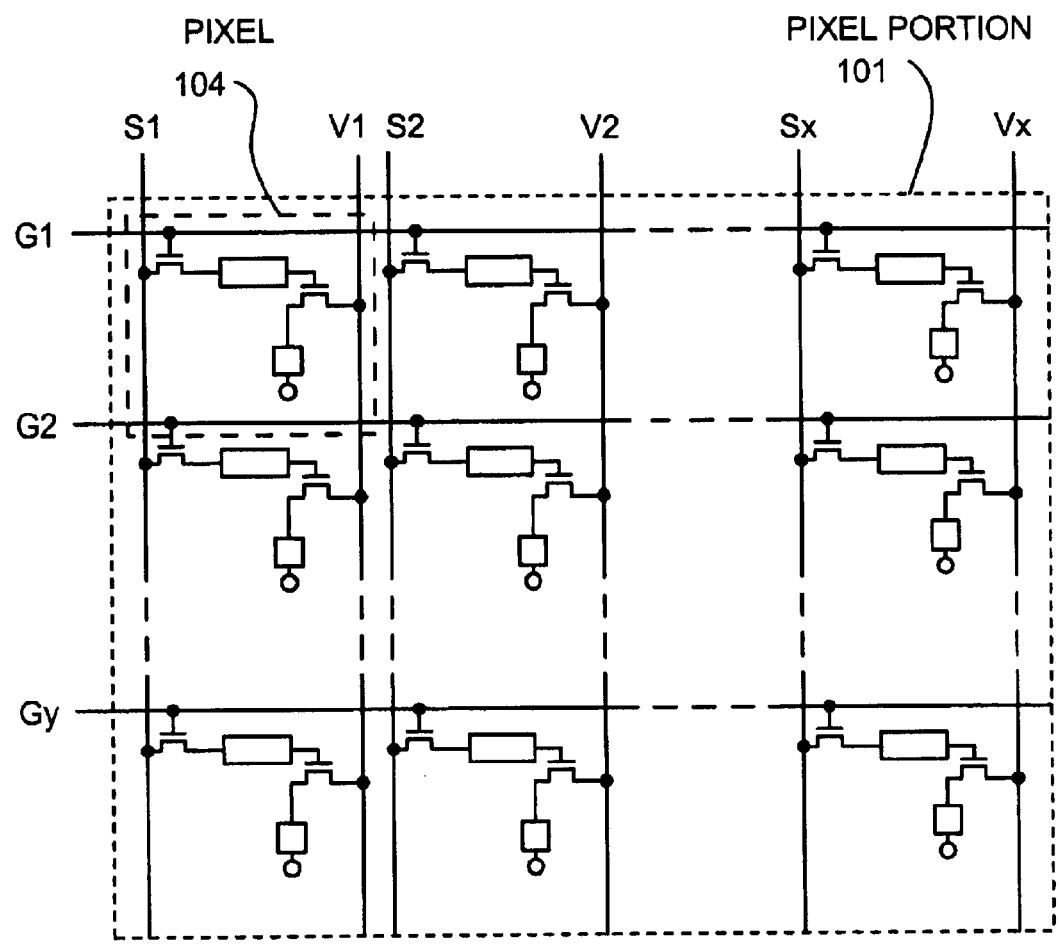
FIG. 2 is a circuit diagram of a pixel portion of an EL display of the present invention.

FIG. 2 shows the structure of the pixel portion 101. Gate signal lines (G1 to Gy) for inputting gate signals, and source signal lines, also referred to as gate signal lines, (S1 to Sx) are formed in the pixel portion 101.

Electric power supply lines (V1 to Vx) are formed. The electric potential of the electric power supply lines (V1 to Vx) is referred to as an electric power supply potential.

Figure 3:
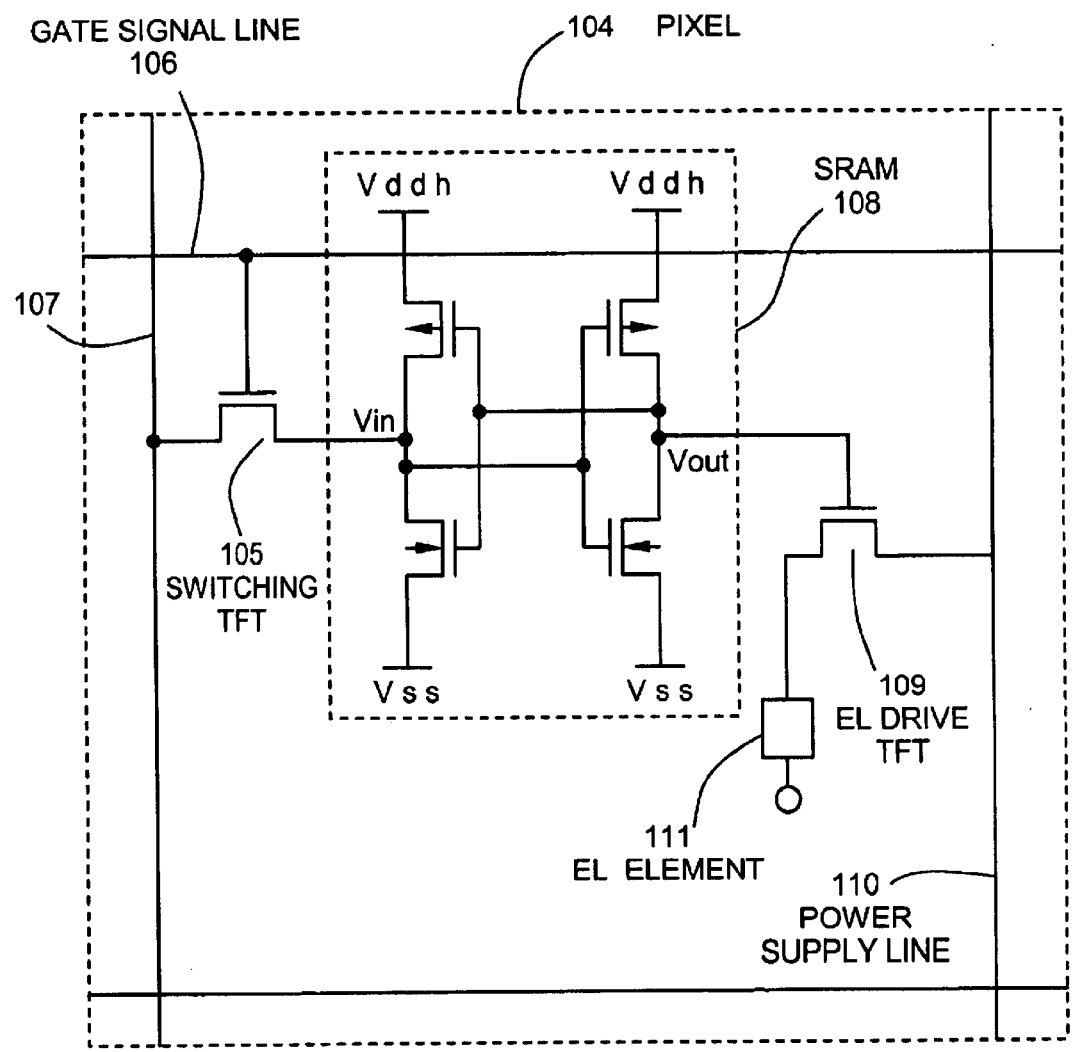
FIG. 3 is a circuit diagram of a pixel of an EL display of the present invention.

A plurality of pixels 104 is arranged in a matrix state in the pixel portion 101. A blow-up view of the pixels 104 is shown in FIG. 3. In FIG. 3, reference numeral 105 denotes a switching TFT. A gate electrode of the switching TFT 105 is connected to a gate signal line 106, one of the gate signal lines (G1 to Gy) for inputting the gate signals. One region of a source region and a drain region of the switching TFT 105 is connected to a source signal line 107, which is one of the source signal lines (S1 to Sx) for inputting the digital data signals, and the other region is connected to an input side of an SRAM 108. The input side of the SRAM 108 is connected to a gate electrode of an EL driver TFT 109.

Further, a source region of the EL driver TFT 109 is connected to an electric power supply line 110, one of the electric power supply lines (V1 to Vx), and a drain region of the EL driver TFT 109 is connected to an EL element 111.

The EL element 111 is composed of an anode, a cathode and an EL layer formed between the anode and the cathode. When the anode is connected to the drain region of the EL driver TFT 109, namely when the anode is a pixel electrode, the cathode becomes an opposing electrode. Conversely, when the cathode is connected to the drain region of the EL driver TFT 109, namely when the cathode is the pixel electrode, the anode becomes the opposing electrode. Note that the electric potential of the opposing electrode is referred to as an opposing electric potential throughout this specification. The electric potential difference between the electric potential of the opposing electrode and the electric potential of the pixel electrode is an EL driver voltage, and the EL driver voltage is applied to the EL layer.

Note that a resistive body may also be formed between the drain region of the EL driver TFT 109 and the EL element 111. By forming the resistive body, it becomes possible to control the amount of electric current flowing from the EL driver TFT to the EL element, and it becomes possible to eliminate the influence of any dispersion in the characteristics of the EL driver TFTs. There are no limitations placed upon the structure of the resistive body, provided that it is an element showing a resistance value which is sufficiently larger than the on resistance of the EL driver TFT 109. The on resistance is the value of the drain voltage of the TFT divided by the amount of drain current flowing through the TFT when the TFT is in an on state. The resistance value of the resistive body may be selected in the range of 1 kΩ to 50 MΩ (preferably from 10 kΩ to 10 MΩ, even better between 50 kΩ and 1 MΩ). It is easy to form a high resistance value semiconductor layer as the resistive body, and therefore preferable.

Figure 4:
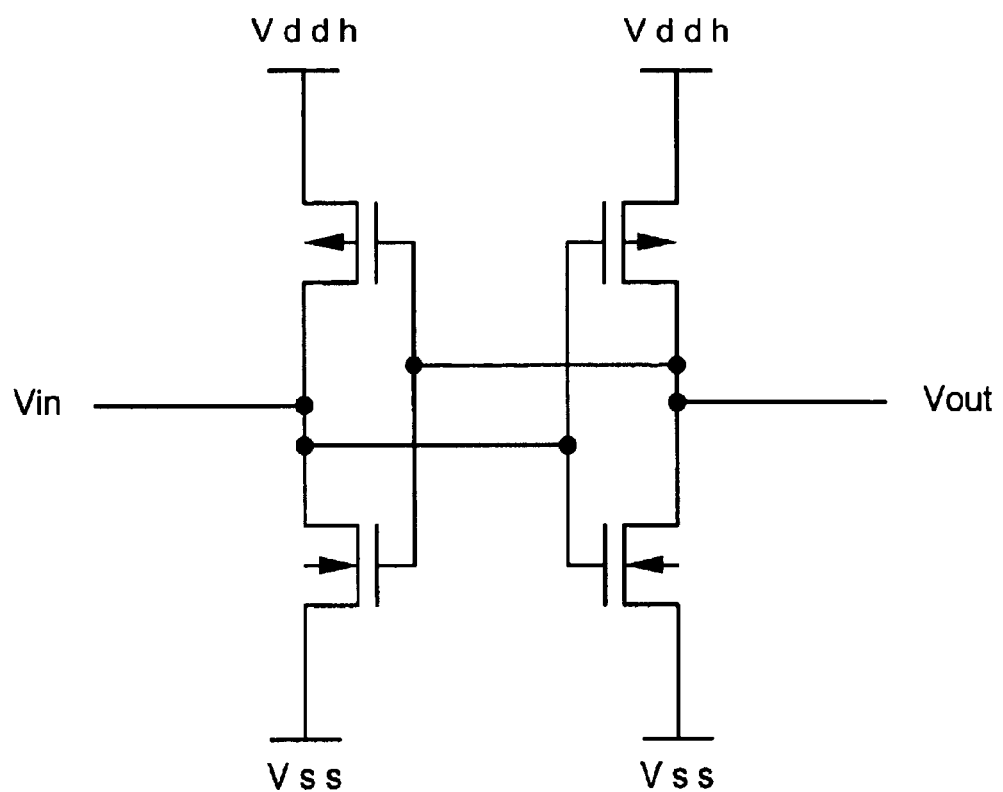
FIG. 4 is an equivalent circuit diagram of an SRAM used by the present invention.

A structure of the SRAM used in the present invention is explained next. An example of a circuit diagram of the SRAM is shown in FIG. 4. The SRAM has two p-channel TFTs and two n-channel TFTs, and the source regions of the p-channel TFTs are connected to a high voltage side of an electric power supply Vddh, while the source regions of the n-channel TFTs are connected to a low voltage side of an electric power source Vss. One p-channel TFT and one n-channel TFT form a pair, and two pairs of p-channel and n-channel TFTs exist within one SRAM.

Drain regions of the p-channel TFT and n-channel TFT pairs are mutually connected. Further, gate electrodes of the p-channel TFT and n-channel TFT pairs are mutually connected. The drain region of one p-channel TFT and n-channel TFT pair is then maintained at the same electric potential as the gate electrode of the other p-channel TFT and n-channel TFT pair. The drain region of one p-channel TFT and n-channel TFT pair is an input side for inputting an input signal Vin, and the drain region of other p-channel TFT and n-channel TFT pair is an output side for outputting an output signal Vout.

The SRAM is designed to store Vin, and to output Vout, a signal in which Vin is inverted. In other words, if Vin is "Hi", then Vout becomes a "Lo" signal corresponding to Vss, and if Vin is Lo, then Vout becomes a Hi signal corresponding to Vddh.

Driving of the EL display of the present invention is explained next. A case of performing $2^n$ gradation display in accordance with an n-bit digital driving method is explained here.

Figure 5:
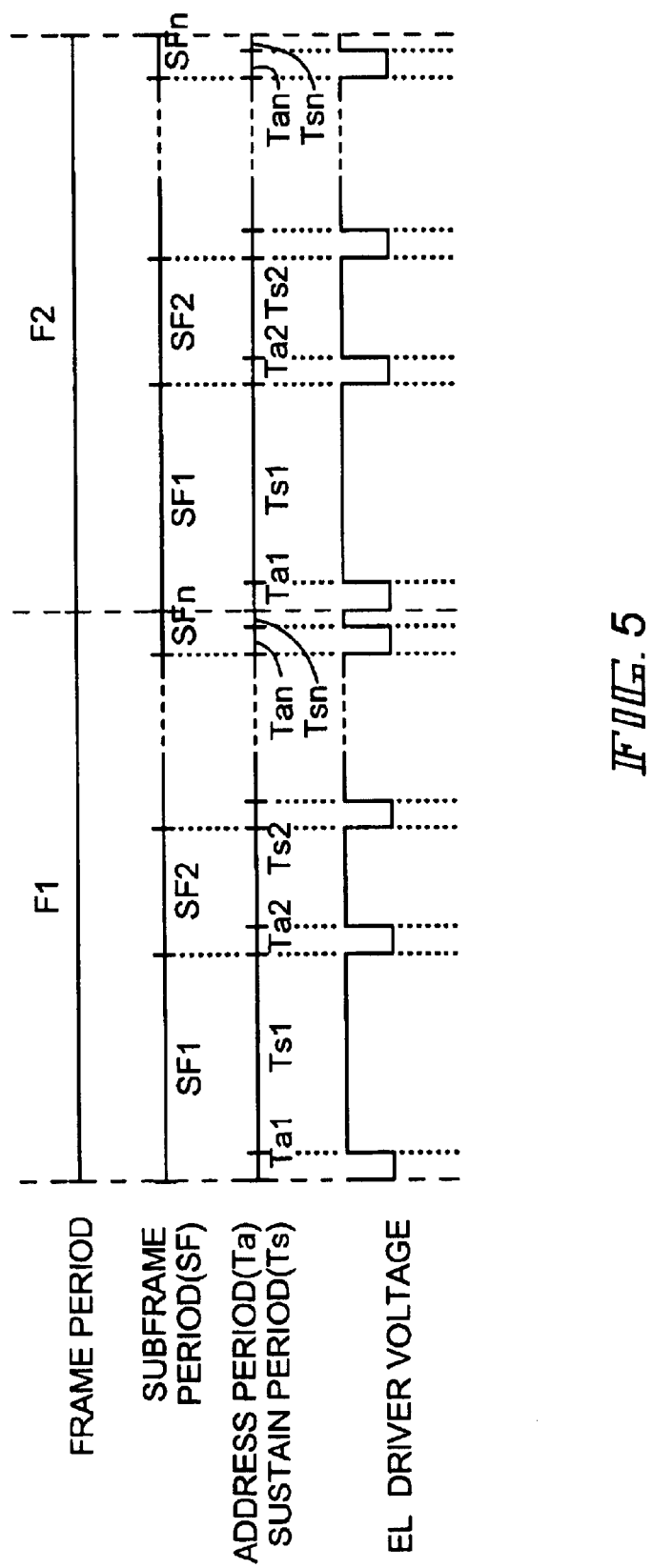
FIG. 5 is a timing chart showing a driver method of an EL display of the present invention.

A timing chart during the digital drive of the EL display of the present invention is shown in FIG. 5. First, one frame period (F) is partitioned into n subframe periods (SF1 to SFn). Note that a period in which all of the pixels of the pixel portion display one image is referred to as one frame period (F). In a normal EL display the oscillation frequency is equal to or greater than 60 Hz. In other words, 60 or more frame periods are formed during one second, and 60 or more images are displayed during one second. If the number of images displayed during one second becomes fewer than 60, then problems such as image flicker start to become visually conspicuous. Note that a plurality of periods into which one frame period is additionally partitioned are referred to as subframe periods. As the number of gradations increases, the number of frame period partitions increases, and the driver circuit must be driven at a high frequency.

One subframe period is divided into a write-in period (Ta) and a display period (Ts). The write-in period is the time required for inputting digital data signals into all of the pixels during one subframe period. Further, the display period (also referred to as a turn-on period) is a period for performing display in which it is determined whether the EL elements emit light or do not emit light in accordance with the digital data signal.

The lengths of write-in periods (Ta1 to Tan) of the n subframe periods (SF1 to SFn), respectively, are all constant. The display periods (Ts) of each of the subframe periods (SF1 to SFn) become display periods (Ts1 to Tsn).

The length of the display periods is set so as to become Ts1: Ts2: Ts3: . . . : Ts(n-1): Tsn=:$2^0$: $2^{-1}$: $2^{-2}$: . . . : $2^{-(n-2)}$: $2^{-(n-1)}$. Note that SF1 to SFn may appear in any order. A desired gradation display, from among the $2^n$ gradations, can be performed by combining the display periods.

First, the electric potential of the opposing electrode (the opposing electric potential) is maintained at the same level as the electric potential of the electric power supply lines (V1 to Vx) in the write-in period. The level of the opposing electric potential may be the same as that of the electric power supply potential, in a range in which the EL elements do not emit light. Note that the electric power supply potential is maintained at a constant voltage at all times. Further, the electric potential difference between the opposing electric potential and the electric power supply potential is referred to as an EL driver voltage in this specification. It is preferable that the EL driver voltage be 0 V during the write-in period, but it may be have any size on the order at which the EL elements do not emit light.

The gate signal line G1 is selected in accordance with the gate signal input to the gate signal line G1. Therefore, all of the switching TFTs 105 whose gate electrode is connected to the gate signal line G1 are placed in the on state. The digital data signal is then input simultaneously to all of the source signal lines (S1 to Sx).

The digital data signal has "0" or "1" information, and the "0" and "1" digital data signals denote signals having voltages which are one of "Hi" or "Lo", respectively.

The digital data signal input to the source signal lines (S1 to Sx) is then input to the SRAM 108 as Vin, through the on state switching TFT 105, and stored. Note that the digital data signal input to the SRAM is referred to as an input digital data signal.

Next, the gate signal line G2 is selected in accordance with the gate signal input to the gate signal line G2. Therefore, all of the switching TFTs 105 connected whose gate electrode is connected to the gate signal line G2 are placed in the on state. The digital data signal is then input simultaneously to all of the source signal lines (S1 to Sx).

The digital data signal input to the source signal lines (S1 to Sx) is then input to the SRAM 108 as Vin, through the on state switching TFT 105, and stored.

The gate signal lines G3 to Gy are also selected in order by the gate signals, and the above operations are repeated. The digital data signal is therefore input to all of the pixels, and the input digital data signal is stored in each pixel. The period until the digital data signal is input to all of the pixels is the write-in period.

The display period begins at the same time that the write-in period is complete. All of the switching TFTs 105 are placed in the off state as the display period begins. The opposing electric potential then has an electric potential difference to the electric power supply potential at a level in which the EL elements emit light.

The digital data signal stored in the SRAM 108 is output from the SRAM 108 as Vout. The digital data signal output from the SRAM as Vout is referred to as an output digital data signal. The output digital data signal is a signal in which the input digital data signal is inverted, and the output digital data signal is input to the gate electrode of the EL driver TFT 109.

When the input digital data signal has "1" information, the output digital data signal will then contain "0" information. If the output digital data signal containing "0" information is input to the gate electrode of the EL driver TFT 109, then the EL driver TFT 109 will be placed into the off state in this embodiment mode. The electric potential of the pixel electrode of the EL element 111 is therefore maintained at the same electric potential as the opposing electric potential. As a result, the EL element 111 of a pixel to which the digital data signal containing "1" information is applied will not emit light.

Conversely, when the input digital data signal has "0" information, the output digital data signal will then contain "1" information. If the output digital data signal containing "1" information is input to the gate electrode of the EL driver TFT 109, then the EL driver TFT 109 will be placed into the on state in this embodiment mode. The electric potential of the pixel electrode of the EL element 111 is therefore maintained at the electric power supply potential. Further, during the display period the opposing electric potential has an electric potential difference to the electric power supply potential at level in which the EL elements emit light. As a result, the EL element 111 of a pixel to which the digital data signal containing "0" information is applied will emit light.

The light emitting state or the non-light emitting state of the EL elements is thus selected in accordance with the information of the digital data signal, and display is performed by all of the pixels simultaneously. An image is formed in accordance with all of the pixels performing display. The period in which the pixels perform display is referred to as the display period.

The display period is any period from Ts1 to Tsn. Predetermined pixels are turned on for the Tsn period here.

The write-in period again begins, and after the data signal is input to all of the pixels, the display period begins. Any of the periods Ts1 to Ts(n-1) becomes the display period at this point. Predetermined pixels are turned on during the Ts(n-1) period here.

Similar operations are repeated in the remaining n-2 subframe periods, Ts(n-2), Ts(n-3), . . . , and Ts1 are set, in order, to be the display period, and predetermined pixels are turned on in the respective subframe periods.

One frame period is complete after the appearance of the n subframe periods. By adding up the lengths of the display periods in which the pixel is turned on, the gradation of that pixel is determined. For example, when n=8, and the brightness for a case of the pixel emitting light during all of the display periods is taken as 100%, when the pixel emits light in Ts1 and Ts2, then a brightness of 75% can be expressed, and when Ts3, Ts5, and Ts8 are selected, a brightness of 16% can be expressed.

Note that the electric power supply potential is always maintained at a constant level in the EL display driving method shown in the embodiment mode, and by changing the opposing electric potential through the write-in period and the display period, the size of EL driver voltage changes, and the emission of light from the EL elements is controlled. However, the present invention is not limited to this structure. The EL display of the present invention may always maintain the opposing electric potential at a constant level, and the electric potential of the pixel electrode may also be changed. In other words, for the case of the embodiment mode, the electric potential of the opposing electrode may conversely always be fixed, and the emission of light from the EL elements may be controlled in accordance with changing the level of the EL driver voltage by changing the electric power supply potential through the write-in period and the display period.

Further, the opposing electric potential is maintained at the same electric potential as the electric power supply potential during the write-in period in the embodiment mode, and therefore the EL elements do not emit light. However, the present invention is not limited to this structure. By always forming an electric potential difference between the opposing electric potential and the electric power supply potential at the level in which the EL element emits the light, display may also be similarly performed in the write-in period as well as the display period. However, in this case the entire subframe period in practice becomes a period in which light is emitted, and therefore the lengths of the subframe periods are set so as to become SF1: SF2: SF3: . . . : SF(n-1): SFn=$2^0$: $2^{-1}$: $2^{-2}$: . . . : $2^{-(n-2)}$: $2^{-(n-1)}$. Compared to the driving method in which light is not emitted during the write-in period, an image having a high brightness can be obtained in accordance with the above structure.

In accordance with the above structure, it becomes possible to store the digital data signal, input to the pixels in the write-in period, until the end of the display period with the present invention. In other words, the electric charge stored in the gate electrode of the EL driver TFT is prevented from being reduced by the leak current of the switching TFT, and it becomes possible to prevent a reduction in brightness of the light emitted by the EL elements.

Note that the volatile memory is formed using TFTs, and therefore it is possible to form it similarly to the switching TFTs and the EL driver TFTs.

A storage capacitor need not be actively formed in the present invention. It becomes possible to shorten the amount of time for inputting the digital data signal to the pixels when the storage capacitor is not formed. Therefore, even if the number of EL display pixels is increased during the digital drive of the time partitioning graduation, the length of the write-in period can be controlled, and consequently the subframe period can be shortened to a certain extent, and the number of image gradations can be increased.

Further, an example of non-interlaced scanning is explained in the embodiment mode, but it is also possible to perform interlaced scanning.

The embodiments of the present invention are shown below.

[Embodiment 1]

An SRAM structure used by the present invention, differing from that shown by FIG. 4, is explained in embodiment 1.

Figure 6:
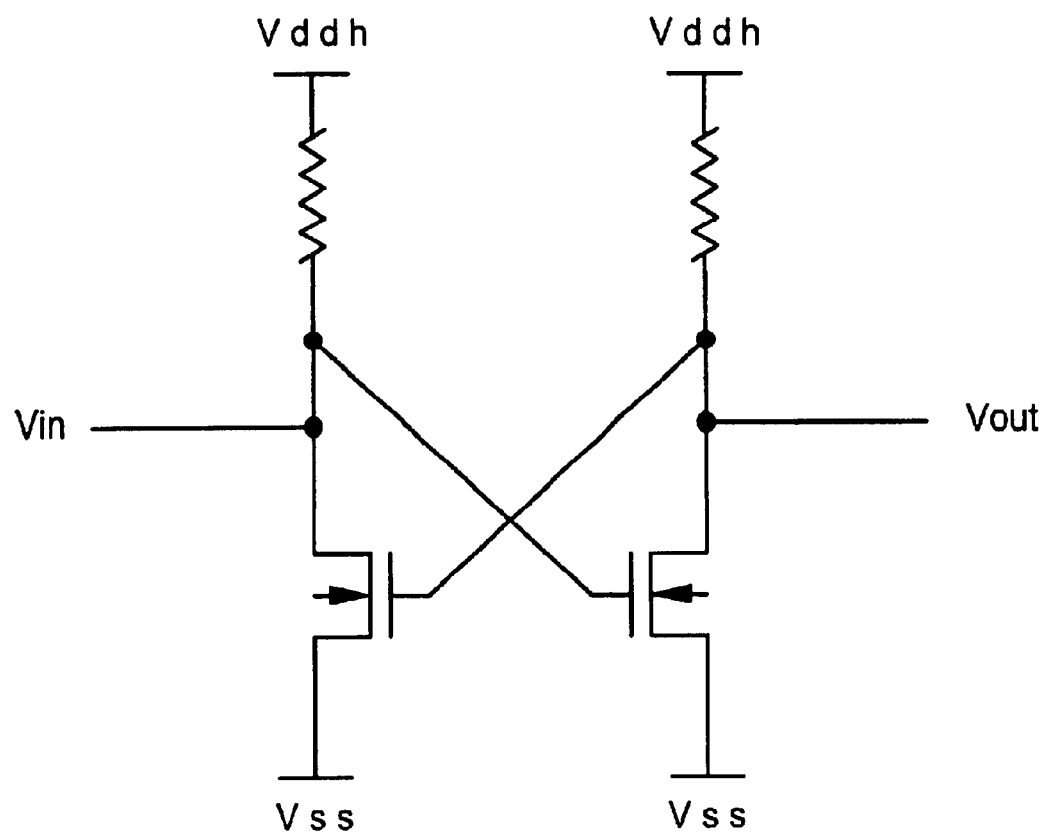
FIG. 6 is an equivalent circuit diagram of an SRAM used by the present invention.

An equivalent circuit diagram of the SRAM of embodiment 1 is shown in FIG. 6. The SRAM has two n-channel TFTs and two resistors. One n-channel TFT and one resister form a pair, and two n-channel TFT and resistor pairs exist within one SRAM. A drain region of the n-channel TFT is connected to a high voltage side electric power supply Vddh, and a source region of the n-channel TFT is connected, through the resistor, to a low voltage side electric power supply Vss.

The drain region of the n-channel TFT is maintained at the same electric potential as a gate electrode of the other n-channel TFT. One n-channel TFT drain region is an input side for inputting an input signal Vin, and the other n-channel TFT drain region is an output side for outputting an output signal Vout.

The SRAM is designed so as to store Vin, and to output Vout, a signal in which Vin is inverted. Namely, if Vin is "Hi", then Vout becomes a "Lo" signal corresponding to Vss, and if Vin is "Lo", then Vout becomes a "Hi" signal corresponding to Vddh.

It is possible to form the resistor at the same time as the n-channel TFT with the SRAM shown by FIG. 6, and therefore it is not necessary to form a p-channel TFT. The number of process steps can be reduced in comparison with the SRAM shown by FIG. 4.

A structure of the SRAM used by the present invention, differing from that shown by FIG. 4 and FIG. 6, is shown next.

Figure 19:
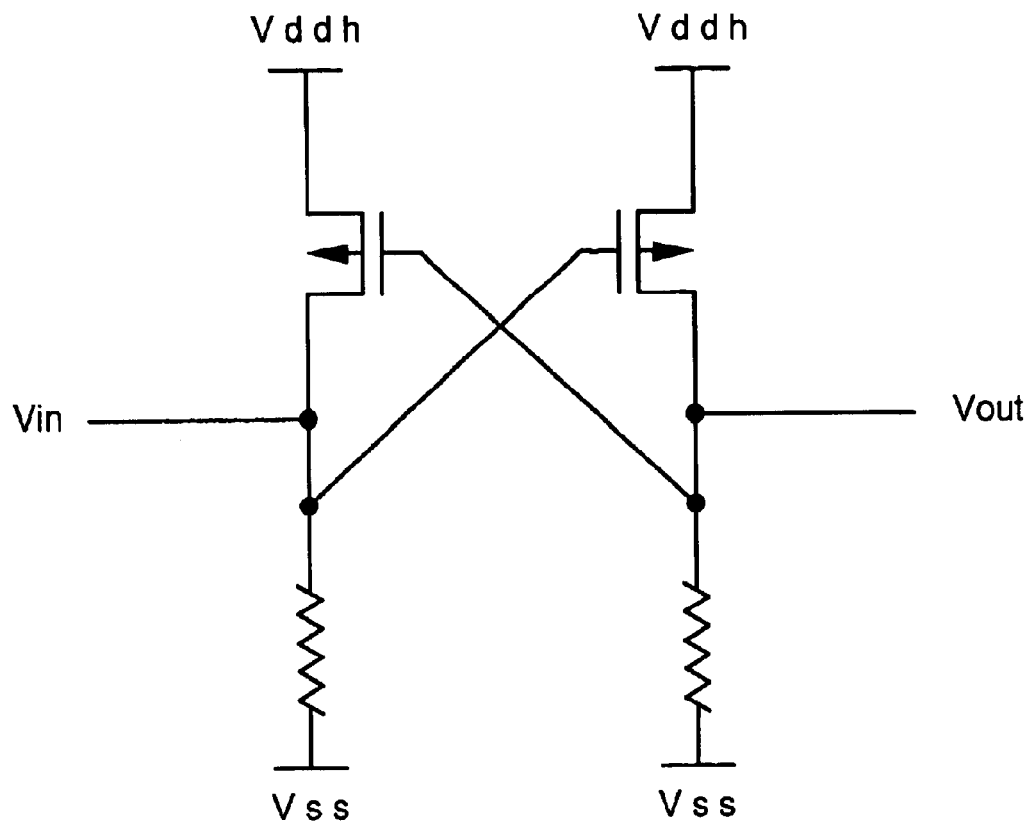
FIG. 19 is an equivalent circuit diagram of an SRAM used by the present invention.

An equivalent circuit diagram of a separate example of the SRAM of embodiment 1 is shown in FIG. 19. The SRAM has two p-channel TFTs and two resistors. One p-channel TFT and one resistor form a pair, and two p-channel TFT and resistor pairs exist within one SRAM. A source region of the p-channel TFT is connected to the high voltage side electric power supply Vddh, and a drain region of the p-channel TFT is connected, through the resistor, to the low voltage side electric power supply Vss.

The drain regions of the p-channel TFT are maintained at the same electric potential as a gate electrode of the other p-channel TFT. One p-channel TFT drain region is an input side for inputting the input signal Vin, and the other p-channel TFT drain region is an output side for outputting the output signal Vout.

The SRAM is designed so as to store Vin, and to output Vout, a signal in which Vin is inverted. Namely, if Vin is "Hi", then Vout becomes a "Lo" signal corresponding to Vss, and if Vin is "Lo", then Vout becomes a "Hi" signal corresponding to Vddh.

It is possible to form the resistor at the same time as the p-channel TFT with the SRAM shown by FIG. 19, and therefore it is not necessary to form an n-channel TFT. The number of process steps can be reduced in comparison with the SRAM shown by FIG. 4.

Another example of the structure of the SRAM used by the present invention, differing from those shown by FIGS. 4, 6, and 19, is shown next.

Figure 20A:
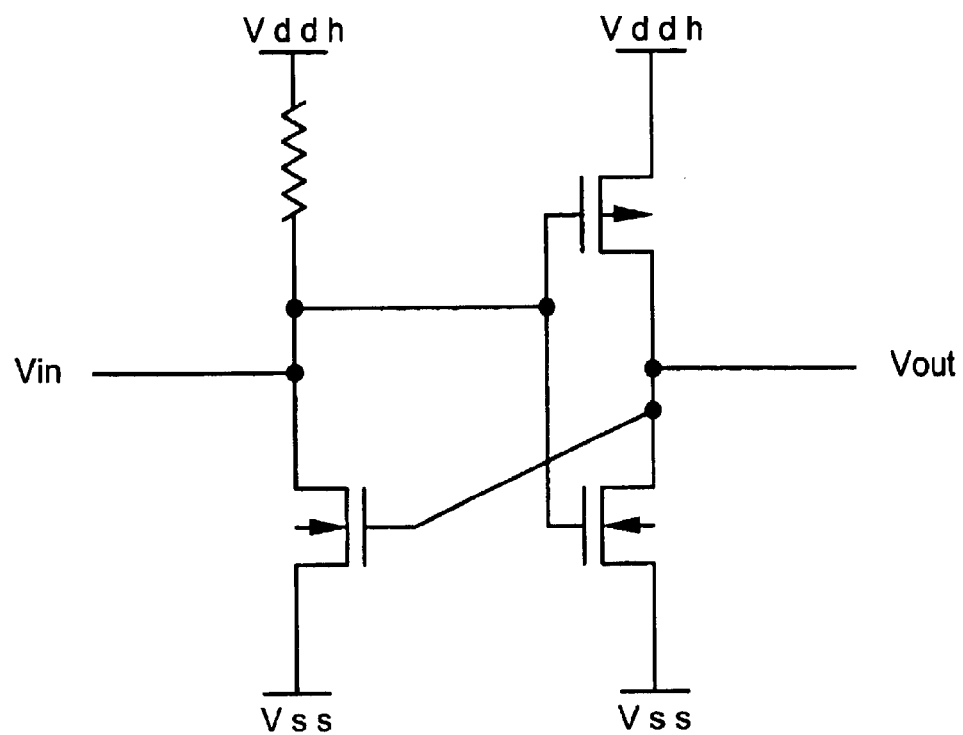
FIGS. 20A and 20B are equivalent circuit diagrams of SRAM used by the present invention.

An equivalent circuit diagram of a separate example of the SRAM of embodiment 1 is shown in FIG. 20A. The SRAM has one p-channel TFT, two n-channel TFTs, and one resistor. Source regions of the two n-channel TFTs are each connected to the low voltage side electric power supply Vss. Then one drain region of one n-channel TFT, from among the two n-channel TFTs, is connected to a drain region of the p-channel TFT, and the other n-channel TFT drain region is connected to the high voltage side electric power supply Vddh, through the resistor. Further, a source region of the p-channel TFT is connected to the high voltage side electric power supply Vddh.

The drain region of each of the n-channel TFTs is maintained at the same electric potential as that of a gate electrode of the other n-channel TFT. One n-channel TFT drain region is an input side for inputting the input signal Vin, and the other n-channel TFT drain region is an output side for outputting the output signal Vout.

The SRAM is designed so as to store Vin, and to output Vout, a signal in which Vin is inverted. Namely, if Vin is "Hi", then Vout becomes a Lo signal corresponding to Vss, and if Vin is "Lo", then Vout becomes a Hi signal corresponding to Vddh.

Figure 20B:
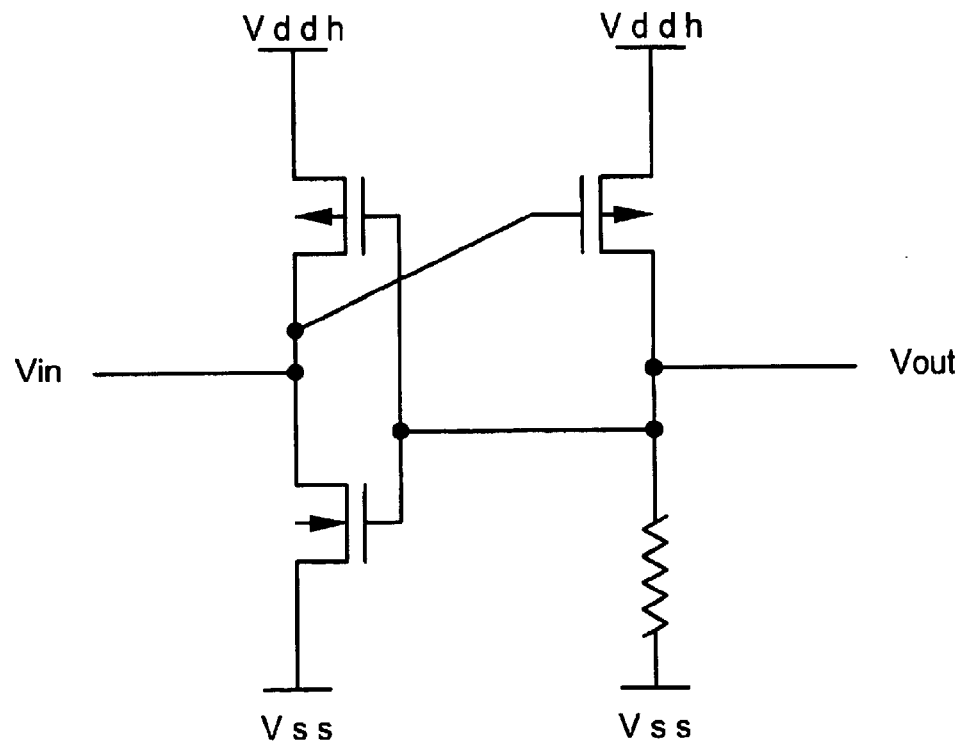

An equivalent circuit diagram of a separate example of the SRAM of embodiment 1 is shown in FIG. 20B. The SRAM has one n-channel TFT, two p-channel TFTs, and one resistor. Source regions of the two p-channel TFTs are each connected to the high voltage side electric power supply Vddh. Then one drain region of one p-channel TFT, from among the two p-channel TFTs, is connected to a drain region of the n-channel TFT, and the other p-channel TFT drain region is connected to the low voltage side electric power supply Vss, through the resistor. Further, a source region of the n-channel TFT is connected to the low voltage side electric power supply Vss.

The drain region of each of the p-channel TFTs is maintained at the same electric potential as that of a gate electrode of the other p-channel TFT. One p-channel TFT drain region is an input side for inputting the input signal Vin, and the other p-channel TFT drain region is an output side for outputting the output signal Vout.

The SRAM is designed so as to store Vin, and to output Vout, a signal in which Vin is inverted. Namely, if Vin is "Hi", then Vout becomes a "Lo" signal corresponding to Vss, and if Vin is Lo, then Vout becomes a Hi signal corresponding to Vddh.

[Embodiment 2]

In Embodiment 2, there will be explained a structure of a pixel of an EL display according to the present invention.

Figure 7A:
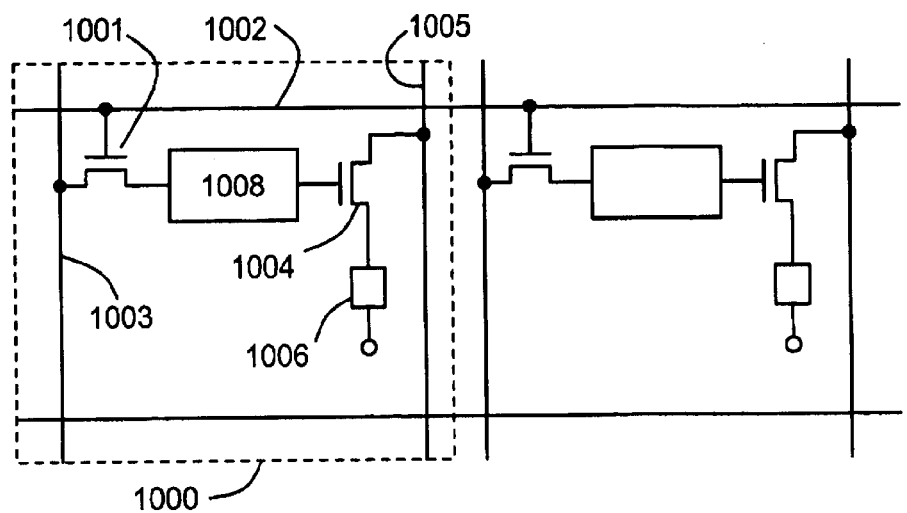
FIGS. 7A and 7B are circuit diagrams of a pixel portion of an EL display of the present invention.

On the pixel portion of the EL display according to the present invention, a plurality of pixels is arranged in a matrix-like configuration. FIG. 7A shows an example of a circuit diagram of the pixel.

In the pixel 1000, a switching TFT 1001 is provided in FIG. 7A. Note that, in the present invention, as a switching TFT 1001, either an n-channel type TFT or a p-channel type TFT may be used. In FIG. 7A, the n-channel type TFT is used as the switching TFT 1001.

The gate electrode of the switching TFT 1001 is connected to the gate signal line 1002 for inputting a gate signal. One of the source region and the drain region of the switching TFT 1001 is connected to the source signal line (also referred to as data signal line) 1003 for inputting a digital data signal while the other is connected to the input side of the SRAM 1008. The output side of a SRAM 1008 is connected to the gate electrode of the EL driver TFT 1004.

The circuit of the SRAM 1008 is shown in FIGS. 4, 6 and 20, but other circuits may also be used.

The source region the EL driving TFT 1004 is connected to the power source supply line 1005 while the drain is connected to the EL element 1006.

The EL element 1006 comprises an anode, a cathode and an EL layer provided between the anode and the cathode. Note that, according to the present invention, in the case where the anode is a pixel electrode and the cathode is an opposite electrode, the drain region of the EL driving TFT 1004 is connected to the anode of the EL element 1006. On the contrary, in the case where the anode is the opposite electrode and the cathode is the pixel electrode, the drain region of the EL driving TFT 1004 is connected to the cathode of the EL element 1006.

Note that, as the EL driving TFT 1004, either n-channel type TFT or p-channel type TFT may be used. However, in the case where the anode of the EL element 1006 is the pixel electrode and the cathode is the opposite electrode, it is preferable that the EL driving TFT 1004 is the p-channel type TFT. Furthermore, on the contrary, in the case where the anode of the EL element 1006 is the opposite electrode, and the cathode is the pixel electrode, it is preferable that the EL driving TFT 1004 is an n-channel type TFT. In FIG. 7A, the p-channel type TFT is used as the EL driving TFT 1004. The anode of the EL element is the pixel electrode, and the cathode is the opposite electrode.

Furthermore, a capacitor is not necessarily be provided to hold the gate voltage of the EL driving TFT 1004 during the non-selection state (off state) of the switching TFT 1001, because the SRAM 1008 is provided in the pixel in the present invention. In the case where the capacitor is provided, the capacitor is connected between the side of the source region or the drain region of the switching TFT 1001 which is not connected to the source signal line, and the power supply line 1005. In a circuit diagram shown in FIG. 7A, the power source supply line 1005 is arranged in parallel with the gate signal line 1003.

Furthermore, an LDD region may be provided in the active layer of the EL driving TFT 1004, and a region (an Lov region) may be formed wherein the LDD region and the gate electrode are overlapped via the gate insulating film. When the EL driving TFT 1004 is either n-channel type TFT or p-channel type TFT, the Lov region is formed on the side of the drain region of the active layer, with the result that a capacity can be further formed between the gate electrode of the EL driving TFT 1004 and the Lov region and the gate electrode of the EL driving TFT 1004 can be retained. In the case where the EL driving TFT 1004 is particularly the n-channel type TFT, the Lov region is formed on the side of the drain region of the active layer, with the result that the on current can be increased.

Note that, in the circuit diagram shown in FIG. 7A, either the switching TFT 1001 or the EL driving TFT 1004 may be formed into a multi-gate structure (a structure including an active layer having two or more channel formation regions connected in series). By forming the switching TFT 1101 into a multi-gate structure, the off current can be decreased. Besides, in the case where the EL driving TFT is formed into a multi-gate structure, the deterioration of the EL driving TFT by heat can be suppressed.

In FIG. 7A, while the power source supply line 1005 and the source signal line 1003 are not overlapped each other, if they are formed in different layers, they can be overlapped via an insulating film. In this case, the pixel portion is more precisely, because the power source supply line 1005 and the source signal line 1003 share an exclusive area.

Figure 7B:
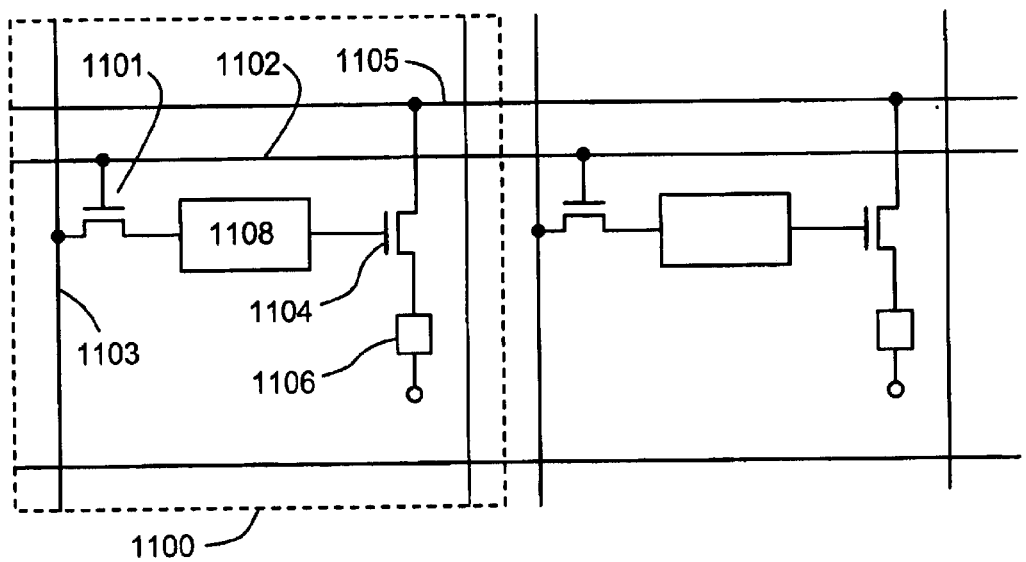

Next, FIG. 7B shows another example of the circuit diagram of the pixel according to the present invention. In FIG. 7B, the switching TFT 1101 is provided in the pixel 1100. Note that, in the present invention, either the n-channel type TFT or the p-channel type TFT may be used as the switching TFT 1101. In FIG. 7B, the n-channel type TFT is used as the switching TFT 1101. The gate electrode of the switching TFT 1101 is connected to the gate signal line 1102 for inputting the gate signal. One of the source region and the drain region of the switching TFT 1101 is connected to the digital data signal line (also referred to as a source signal line) 1103 for inputting a digital data signal while the other is connected to the input side of the SRAM 1108. The output side of the SRAM 1108 is connected to the gate electrode of the EL driving TFT 1104.

The circuit of the SRAM 1008 is shown in FIGS. 4, 6 and 20, but other circuits may also be used.

Then, the source region of the EL driving TFT 1104 is connected to the power source supply line 1105 while the drain region is connected to the EL element 1106.

The EL element 1106 comprises an anode, a cathode and an EL layer provided between the anode and the cathode. Note that, in the present invention, in the case where the anode is the pixel electrode and the cathode is the opposite electrode, the drain region of the EL driving TFT 1104 is connected to the anode of the EL element 1106. On the contrary, in the case where the anode is the opposite electrode and the cathode is the pixel electrode, the drain region of the EL driving TFT 1104 is connected to the cathode of the EL element 1106. Note that, as the EL driving TFT 1104, either the n-channel type TFT or the p-channel type TFT may be used. However, in the case where the anode of the EL element 1106 is the pixel electrode and the cathode thereof is the opposite electrode, it is preferable that the EL driving TFT 1104 is the p-channel type TFT. Furthermore, on the contrary, in the case where the anode of the EL element 1106 is the opposite electrode and the cathode thereof is the pixel electrode, it is preferable that the EL driving TFT 1104 is the n-channel type TFT. In FIG. 7B, the p-channel type TFT is used in the EL driving TFT 1104. The anode of the EL element 1106 is the pixel electrode and the cathode thereof is the opposite electrode.

Furthermore, a capacitor is not necessary to be provided to hold the gate voltage of the EL driving TFT 1104 during the non-selection period of the switching TFT 1101, because the SRAM 1008 is provided in the pixel in the present invention. In the case where the capacitor is provided, the capacitor is connected between the side of the source region or the drain region of the switching TFT 1101 which is not connected to the source signal line, and the power source supply line 1105. In the circuit diagram shown in FIG. 7B, the power source supply line 1105 and the gate signal line 1102 are arranged in parallel.

Besides, an LDD region may be provided in the active layer of the EL driving TFT 1104, and a region (an Lov region) may be formed wherein the LDD region and the gate electrode are overlapped via the gate insulating film. When the EL driving TFT 1104 is either n-channel type TFT or p-channel type TFT, the Lov region is formed on the side of the drain region of the active layer, with the result that a capacity can be further formed between the gate electrode of the EL driving TFT 1004 and the Lov region, and the gate electrode of the EL driving TFT 1004 can be retained. In the case where the EL driving TFT 1104 is particularly the n-channel type TFT, the Lov region is formed on the side of the drain region of the active layer, with the result that the on current can be increased.

Note that, in the circuit diagram shown in FIG. 7B, either the switching TFT 1101 or the EL driving TFT 1104 may be formed into a multi-gate structure. By forming the switching TFT into a multi-gate structure, the off current can be decreased.

Besides, in the case where the EL driving TFT is formed into a multi-gate structure, the deterioration of the EL driving TFT by heat can be suppressed.

In FIG. 7B, while the power source supply line 1105 and the source signal line 1102 are provided not overlapped each other, if they formed in different layer, they can be provided overlapped via insulating film. In this case, the pixel portion is more precisely, because the power source supply line 1105 and the source signal line 1102 own an exclusive area jointly.

Figure 8A:
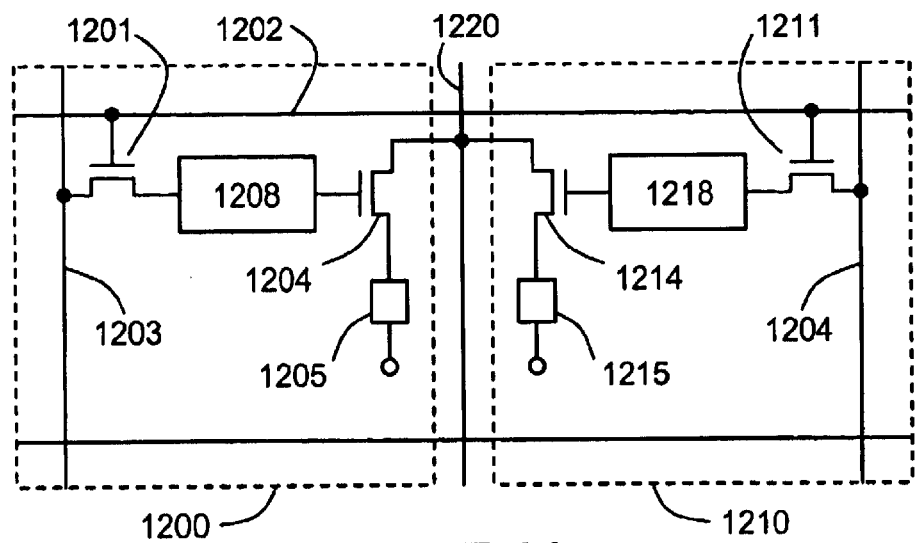
FIGS. 8A and 8B are circuit diagrams of a pixel portion of an EL display of the present invention.

Next, FIG. 8A shows another example of a circuit diagram of a pixel according to the present invention. In FIG. 8A, the pixel 1200 and the pixel 1210 are provided adjacent to each other. In FIG. 8A, reference numerals 1201 and 1211 denote switching TFTs. Note that, in the present invention, as switching TFTs 1201 and 1211 either the n-channel type TFT or the p-channel type TFT may be used. In FIG. 8A, the n-channel type TFT is used in the switching TFT 1201 and the switching TFT 1211. The gate electrodes of the switching TFTs 1201 and 1211 are connected to the gate signal line 1202 for inputting the gate signal. One of the source region and the drain region of the switching TFT 1201 and 1211 is connected to the source signal line for inputting a digital data signal 1203 or 1204 while the other is connected to input side of the SRAM 1208 and 1218, respectively. The output side of the SRAM 1208 and 1218 are connected to the gate electrode of the EL driving TFT 1204 and 1214, respectively.

As a SRAM 1208 and 1218, the SRAM can be not only used shown in FIGS. 4, 6 and 20, but also other structure one, of course.

Then, one of the source region of the EL driving TFTs 1204 and 1214 is connected to the power source supply line 1220 while the drain region is connected to the EL elements 1205 and 1215, respectively. In this manner, in this embodiment, two adjacent pixels share one power source supply line 1220. As a consequence, as compared with the structure shown in FIG. 7, number of the power source supply lines can be decreased. When the ratio of the wiring with respect to the whole pixel portion is small, the light shielding by the wiring can be suppressed in the case where the wiring is provided in a direction of the light emission of the EL layer.

The EL elements 1205 and 1215 comprise an anode, a cathode, and an EL layer provided between the anode and the cathode respectively. Note that, according to the present invention, in the case where the anode is the pixel electrode and the cathode is the opposite electrode, either the source region or the drain region of the EL driving TFTs 1204 and the 1214 is connected to the anodes of the EL elements 1205 and 1215. On the contrary, in the case where the anode is the opposite electrode and the cathode is the pixel electrode, the drain region of the EL driving TFTs 1204 and 1214 is connected to the cathodes of the EL elements 1205 and 1215.

Note that, as the EL driving TFTs 1204 and 1214, either the n-channel type TFT or the p-channel type TFT may be used. However, in the case where the anodes of the EL elements 1205 and 1215 are pixel electrodes while the cathodes thereof are opposite electrodes, it is preferable that the EL driving TFTs 1204 and 1214 are the p-channel type TFTs. Besides, on the contrary, in the case where the anodes of the EL elements 1205 and 1215 are the opposite electrodes, preferably the EL driving TFTs 1204 and 1214 are n-channel type TFTs. In FIG. 8A, as the EL driving TFTs 1204 and 1214, the p-channel type TFTs are used. The anode of the EL elements 1205 and 1215 is the pixel electrode and the cathode thereof is the opposite electrode.

Furthermore, when the switching TFT 1201 and 1211 are set in the non-selection state (off state), a capacitor is not necessary to be provided for holding the gate voltage of the EL driving TFTs 1204 and 1214 because the SRAM 1208 and 1218 are provided in a pixel in the present invention. In the case where the capacitor is provided, the capacitor may be connected between the side of the drain region or the source region of the switching TFT 1201 and 1211 which are not connected to the source signal line and the power source supply line 1220.

Furthermore, an LDD region is provided in the active layers of the EL driving TFTs 1204 and 1214 with the result that a region (a Lov region) may be formed wherein the LDD region and the gate electrode overlaps via the gate insulating film. When the EL driving TFT 1204 is either n-channel type TFT or p-channel type TFT, the Lov region is formed on the side of the drain region of the active layer, with the result that a capacity can be further formed between the gate electrode of the EL driving TFT 1204, 1214 and the Lov region, and the gate electrode of the EL driving TFT 1204, 1214 can be retained. In the case where the EL driving TFT 1204 is particularly the n-channel type TFT, forming the Lov region on the side of the drain region of the active layer can increase the on current.

Note that, in a circuit diagram shown in FIG. 8A, the switching TFT 1201 and 1211, or the EL driving TFT 1204 and 1214 may be formed into a multi-gate structure. Forming the switching TFT 1201 and 1211 into a multi-gate structure can lower the off current.

Besides, though not shown, in the case where the EL driving TFT is formed into a multi-gate structure, the deterioration of the EL driving TFT by heat can be suppressed.

Figure 8B:
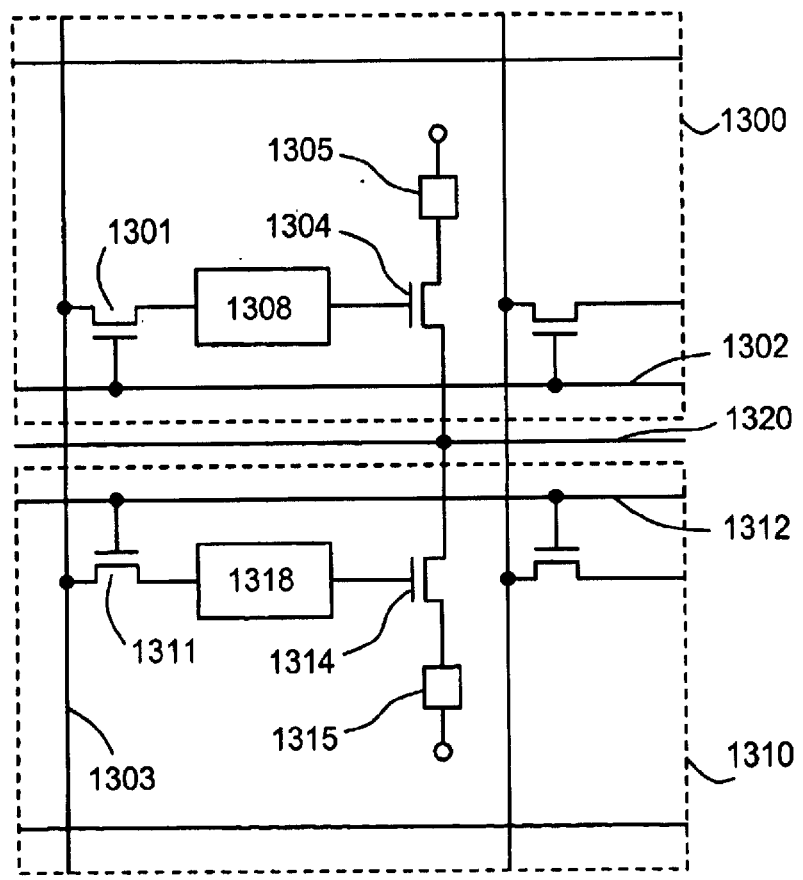

Next, FIG. 8B shows another example of a circuit diagram of a pixel according to the present invention. In FIG. 8B, the pixel 1300 and the pixel 1310 are provided adjacent to each other. In FIG. 8B, reference numerals 1301 and 1311 denote the switching TFTs. Note that, in the present invention, as the switching TFT 1301 and 1311, either the n-channel type TFT or the p-channel type TFT can be used. In FIG. 19B, the n-channel type TFT is used as the switching TFT 1301 and 1311. The gate electrodes of the switching TFTs 1301 and the 1311 are connected to the gate signal lines 1302 and 1312 for inputting the gate signal respectively. One of the source region and the drain region of the switching TFT 1301 and 1311 is connected to the source signal line 1303 for inputting digital data signal, while the other is connected to the input side of the SRAM 1308 and 1318, respectively. The output side of SRAM 1308 and 1318 is connected to the gate electrode of the EL driving TFT 1304 and 1314.

As a SRAM 1308 and 1318, the SRAM can be not only used shown in FIGS. 4, 6 and 20, but also other structure one, of course.

Then, one of the source region of the EL driving TFTs 1304 and 1314 is connected to the power source supply line 1320, while the drain region is connected to the EL elements 1305 and 1315 respectively. In this manner, in the present embodiment, two adjacent pixels share one power source supply line 1320. As a consequence, as compared with the structure shown in FIG. 7, the number of power supply lines can be decreased. When the ratio of the wiring with respect to the whole pixel portion is small, the light shielding by the wiring can be suppressed in the case where the wiring is provided in a direction of light emission of the EL layer. Then, in a circuit diagram shown in FIG. 8B, the power supply line 1320 is provided in parallel with the gate signal lines 1302 and 1312.

The EL elements 1305 and 1315 comprise an anode, a cathode, and an EL layer provided between the anode and the cathode respectively. Note that, according to the present invention, in the case where the anode is the pixel electrode and the cathode is an opposite electrode, the drain region of the EL driving TFTs 1304 and 1314 is connected to the anodes of the EL elements 1305 and 1315. On the contrary, in the case where the anode is the opposite electrode and the cathode is the pixel electrode, the drain region of the EL driving TFTs 1304 and 1314 is connected to the cathodes of the EL elements 1305 and 1315. Note that, as the EL driving TFTs 1304 and 1314, either the n-channel type TFT or the p-channel type TFT may be used. However, in the case where the anodes of the EL elements 1305 and 1315 are pixel electrodes and the cathodes thereof are opposite electrodes, it is preferable that the EL driving TFT 1304 and 1314 are p-channel type TFTs. Besides, on the contrary, in the case where the anodes of the EL elements 1305 and 1315 are opposite electrodes and the cathodes thereof are pixel electrodes, it is preferable that the EL driving TFTs 1304 and 1314 are n-channel type TFTs. In FIG. 8B, the p-channel type TFTs are used as the EL driving TFTs 1304 and 1314, so that the anode of the EL elements 1305 and 1315 are the pixel electrode and the cathode thereof is the opposite electrode.

Furthermore, when the switching TFT 1301 and 1311 are set in the non-selection state (off-state), a capacitor is not necessary to be provided for holding the gate voltage of the EL driving TFTs 1304 and 1314, because the SRAM 1308 and 1318 are provided in the pixel in the present invention. In the case where the capacitor is provided, the capacitor is connected between the side of the source region and the drain region of the switching TFT 1301 and 1311 which is not connected to the source signal line, and the power source supply line 1320.

Furthermore, an LDD region is provided in the active layers of the EL driving TFTs 1304 and 1314, so that a region (the Lov region) may be formed wherein the LDD region and the gate electrode are overlapped via the gate insulating film. When the EL driving TFT 1304 and 1314 are either n-channel type TFT or p-channel type TFT, the Lov region is formed on the side of the drain region of the active layer, with the result that a capacity can be further formed between the gate electrode of the EL driving TFT 1304, 1314 and the Lov region, and the gate electrode of the EL driving TFT 1304, 1314 can be retained. In the case where the EL driving TFTs 1304 and 1314 are particularly the n-channel type TFTs, the on current can be increased by forming a Lov region on the side of the drain region of the active layers.

Note that, in a circuit diagram shown in FIG. 8B, the switching TFTs 1301 and 1311 or the EL driving TFTs 1304 and 1314 may be formed into a multi-gate structure. By forming the switching TFT of the pixel shown in FIG. 8B into a multi-gate structure, the off current can be decreased, and the gate voltage of the EL driving TFT 1304 and 1314 can be retained without a capacitor.

Besides, though not shown, in the case where the EL driving TFT is formed into the multi-gate structure, the deterioration of the EL driving TFTs by heat can be suppressed.

Note that, in this embodiment, a resistor may be provided between the pixel electrodes, which are, the EL element has the drain region of the EL driving TFT. By providing the resistor, the quantity of current supplied from the EL driving TFT to the EL element is controlled so that the influence of the characteristic of the EL driving TFT on the disparity may be prevented. The resistor may be an element showing a resistance value sufficiently larger than the on resistance of the EL driving TFT. Therefore, the structure or the like is not restricted. Note that, the on resistance is a value obtained by dividing the drain voltage of the TFT with the drain current which flows at that time when the TFT is turned on. As a resistance value of the resistor, any in the scope of 1 kΩ through 50 MΩ (preferably, 10 kΩ through 10 MΩ, or more preferably 50 kΩ through 1 MΩ) may be selected. When a semiconductor layer having a high resistance value as a resistor is used, the formation is easy and preferable.

[Embodiment 3]

An example of manufacturing an EL display using the present invention is explained in embodiment 3.

Figure 9A:
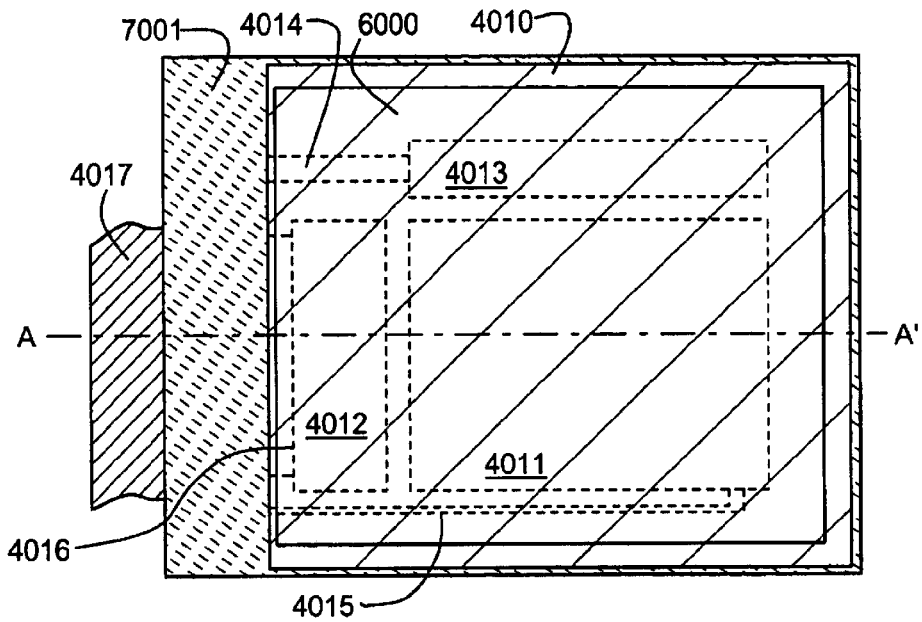
FIGS. 9A and 9B are a top view and a cross sectional diagram, respectively, of an EL display of the present invention.

FIG. 9A is a top view of an EL display device using the present invention. In FIG. 9A, reference numeral 4010 is a substrate, reference numeral 4011 is a pixel portion, reference numeral 4012 is a source signal side driver circuit, and reference numeral 4013 is a gate signal side driver circuit. The driver circuits are connected to external equipment, through an FPC 4017, via wirings 4014 to 4016.

A covering material 6000, a sealing material (also referred to as a housing material) 7000, and an airtight sealing material (a second sealing material) 7001 are formed so as to enclose at least the pixel portion, preferably the driver circuits and the pixel portion, at this point.

Figure 9B:
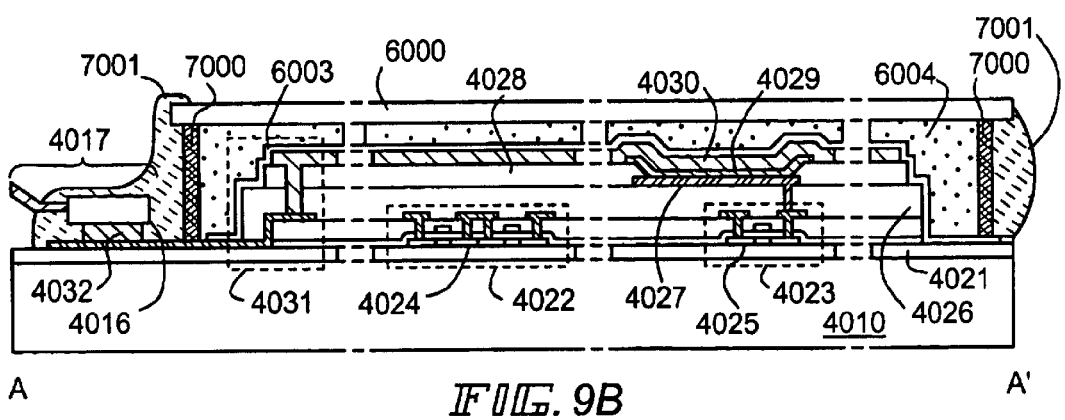

Further, FIG. 9B is a cross sectional structure of the EL display device of the present invention. A driver circuit TFT 4022 (note that a CMOS circuit in which an n-channel TFT and a p-channel TFT are combined is shown in the figure here), a pixel portion TFT 4023 (note that only an EL driver TFT for controlling the current flowing to an EL element is shown here) are formed on a base film 4021 on a substrate 4010. The TFTs may be formed using a known structure (a top gate structure or a bottom gate structure).

After the driver circuit TFT 4022 and the pixel portion TFT 4023 are completed, a pixel electrode 4027 is formed on an interlayer insulating film (leveling film) 4026 made from a resin material. The pixel electrode is formed from a transparent conducting film for electrically connecting to a drain of the pixel TFT 4023. An indium oxide and tin oxide compound (referred to as ITO) or an indium oxide and zinc oxide compound can be used as the transparent conducting film. An insulating film 4028 is formed after forming the pixel electrode 4027, and an open portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In embodiment 3, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to use a method of depositing the EL layer 4029 and the cathode 4030 in an inert gas atmosphere or within a vacuum. The above film deposition becomes possible in embodiment 3 by using a multi-chamber method (cluster tool method) film deposition apparatus.

Note that a lamination structure of a LiF (lithium fluoride) film and an Al (aluminum) film is used in embodiment 3 as the cathode 4030. Specifically, a 1 nm thick LiF (lithium fluoride) film is formed by evaporation on the EL layer 4029, and a 300 nm thick aluminum film is formed on the LiF film. An MgAg electrode, a known cathode material, may of course also be used. The wiring 4016 is then connected to the cathode 4030 in a region denoted by reference numeral 4031. The wiring 4016 is an electric power supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 6003, a filling material 6004, and the covering material 6000 are formed covering the surface of the EL element thus made.

In addition, the sealing material 7000 is formed between the covering material 6000 and the substrate 4010, so as to surround the EL element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicone resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of $\mu$m of aluminum foil is sandwiched by a PVF film or a Mylar film.

However, depending upon the light emission direction from the EL device (the light radiation direction), it is necessary for the covering material 6000 to have light transmitting characteristics.

Further, the wiring 4016 is electrically connected to the FPC 4017 through a gap between the sealing material 7001 and the substrate 4010. Note that although an explanation of the wiring 4016 has been made here, the wirings 4014 and 4015 are also electrically connected to the FPC 4017 by similarly passing underneath the sealing material 7001 and sealing material 7000.

In FIGS. 9A and 9B, the covering material 6000 is bonded after forming the filling material 6004, and the sealing material 7000 is attached so as to cover the lateral surfaces (exposed surfaces) of the filling material 6004, but the filling material 6004 may also be formed after attaching the covering material 6000 and the sealing material 7000. In this case, a filling material injection opening is formed through a gap formed by the substrate 4010, the covering material 6000, and the sealing material 7000. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Figure 10A:
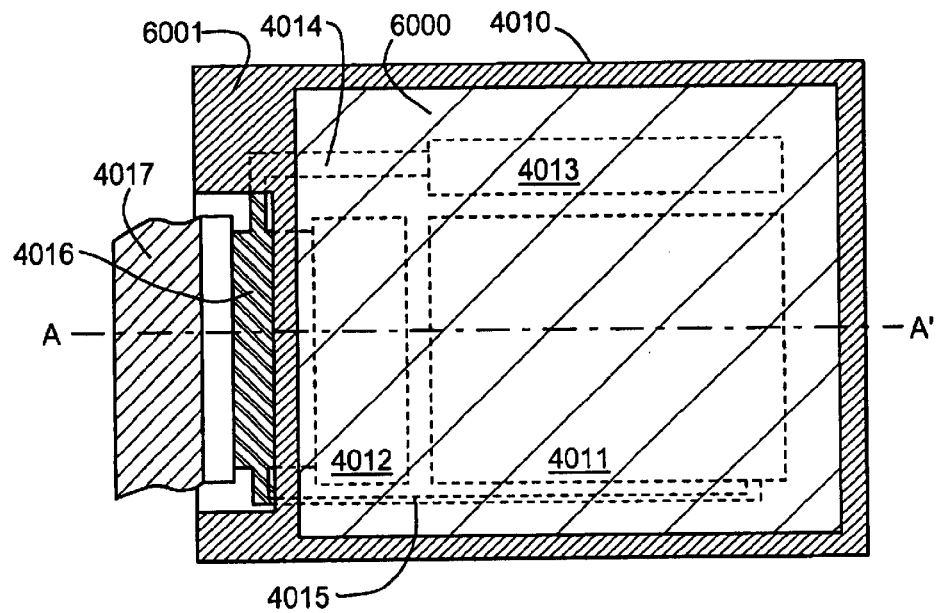
FIGS. 10A and 10B are a top view and a cross sectional diagram, respectively, of an EL display of the present invention.
Figure 10B:
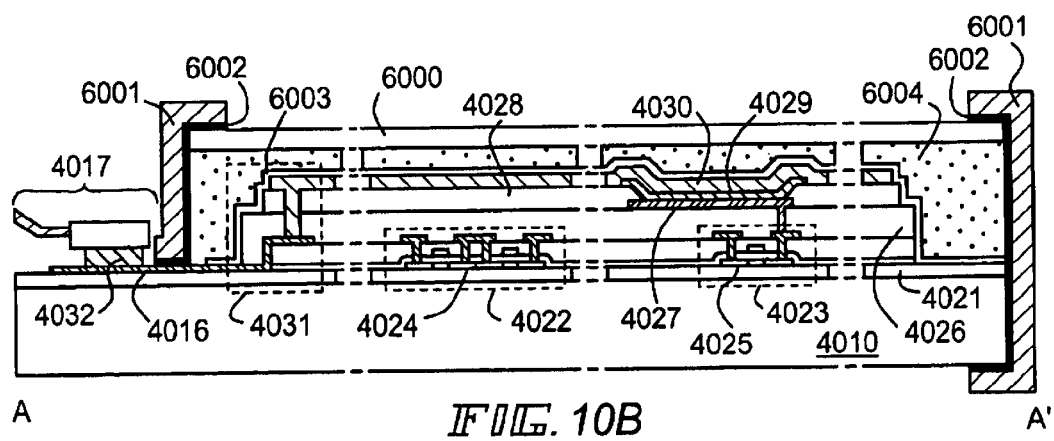

Next, an example of manufacturing an EL display device having a structure which differs from that of FIGS. 9A and 9B is explained using FIGS. 10A and 10B. Parts having the same reference numerals as those of FIGS. 9A and 9B indicate the same portions, and therefore an explanation of those parts is omitted.

FIG. 10A is a top view of an EL display device of embodiment 3, and FIG. 10B shows a cross sectional diagram in which FIG. 10A is cut along the line A–A'.

In accordance with FIGS. 9A and 9B, manufacturing is performed through the step of forming the passivation film 6003 covering the EL element.

In addition, the filling material 6004 is formed so as to cover the EL element. The filling material 6004 also functions as an adhesive for bonding the covering material 6000. PVC (polyvinyl chloride), epoxy resin, silicone resin, PVB (polyvinyl butyral), and EVA (ethylene vinyl acetate) can be used as the filling material 6004. If a drying agent is provided on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filler material 6004, it is preferable to use a sheet with a structure in which several tens of $\mu$m of aluminum foil is sandwiched by a PVF film or a Mylar film.

However, depending upon the light emission direction from the EL device (the light radiation direction), it is necessary for the covering material 6000 to have light transmitting characteristics.

After bonding the covering material 6000 using the filling material 6004, the frame material 6001 is attached so as to cover the lateral surfaces (exposed surfaces) of the filling material 6004. The frame material 6001 is bonded by the sealing material (which functions as an adhesive) 6002. It is preferable to use a light hardening resin as the sealing material 6002 at this point, but provided that the heat resistance characteristics of the EL layer permit, a thermal hardening resin may also be used. Note that it is preferable that the sealing material 6002 be a material which, as much as possible, does not transmit moisture and oxygen. Further, a drying agent may also be added to an inside portion of the sealing material 6002.

The wiring 4016 is electrically connected to the FPC 4017 through a gap between the sealing material 6002 and the substrate 4010. Note that although an explanation of the wiring 4016 has been made here, the wirings 4014 and 4015 are also electrically connected to the FPC 4017 by similarly passing underneath the sealing material 6002.

Note that the covering material 6000 is bonded, and the frame material 6001 is attached so as to cover the lateral surfaces (exposed surfaces) of the filling material 6004, after forming the filling material 6004 in FIGS. 10A and 10B, but the filling material 6004 may also be formed after attaching the covering material 6000 and the frame material 6001. In this case, a filling material injection opening is formed through a gap formed by the substrate 4010, the covering material 6000, and the frame material 6001. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Note that it is possible to implement the constitution of embodiment 3 by freely combining it with the constitution of embodiment 1 or embodiment 2.

[Embodiment 4]

Figure 11:
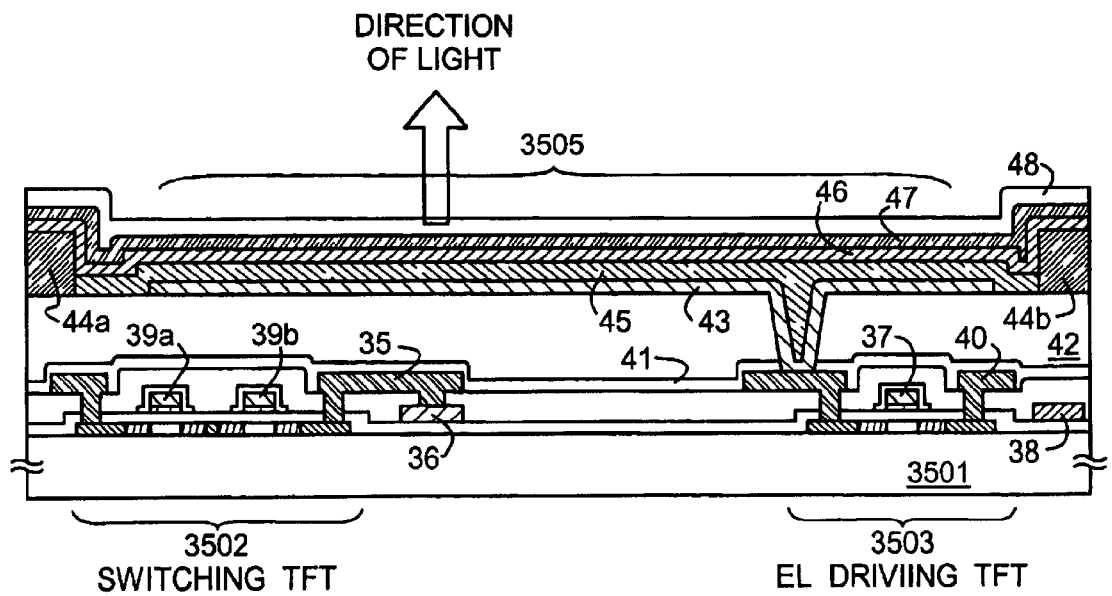
FIG. 11 is a schematic diagram of a cross sectional structure of an EL display of the present invention.

A more detailed cross sectional structure of a pixel portion is shown here in FIG. 11. A switching TFT 3502 formed on a substrate 3501 is manufactured by using a known method. A double gate structure is used in embodiment 4. Note that although a double gate structure is used in embodiment 4, a single gate structure, a triple gate structure, and a multi gate structure possessing a greater number of gates may also be used. Further, SRAM TFTs are not shown in the figures in order to simplify the explanation in embodiment 4, but it is possible to use the same structure as that of a switching TFT and an EL driver TFT.

An EL driver TFT 3503 is an n-channel TFT, and is manufactured using a known method. A drain wiring 35 of the switching TFT 3502 is electrically connected to an input side of an SRAM (not shown in the figures) by a wiring 36. Further, a wiring denoted by reference numeral 38 is a gate signal line for electrically connecting gate electrodes 39a and 39b of the switching TFT 3502.

A single gate structure of the EL driver TFT 3503 is shown in the figures in embodiment 4, but a multi-gate structure in which a plurality of TFTs are connected in series may also be used. In addition, a structure in which a plurality of TFTs are connected in parallel, effectively partitioning into a plurality of channel forming regions, and which can perform radiation of heat with high efficiency, may also be used.

Furthermore, a drain wiring 40 is connected to an electric power supply line (not shown in the figures), and a constant voltage is always applied.

A first passivation film 41 is formed on the switching TFT 3502 and the EL driver TFT 3503, and a leveling film 42 is formed on top of that from an insulating resin film. It is extremely important to level the step due to the TFTs using the leveling film 42. An EL layer formed later is extremely thin, so there are cases in which defective light emissions occur. Therefore, to form the EL layer with as level a surface as possible, it is preferable to perform leveling before forming a pixel electrode.

Furthermore, reference numeral 43 denotes a pixel electrode (EL element cathode) made from a conducting film with high reflectivity, and this is electrically connected to a drain region of the EL driver TFT 3503. It is preferable to use a low resistance conducting film, such as an aluminum alloy film, a copper alloy film, and a silver alloy film, or a laminate of such films. Of course, a lamination structure with another conducting film may also be used.

In addition, a light emitting layer 45 is formed in the middle of a groove (corresponding to a pixel) formed by banks 44a and 44b, which are formed by insulating films (preferably resins). Note that only one pixel is shown in the figures here, but the light emitting layer may be divided to correspond to each of the colors R (red), G (green), and B (blue). A δ conjugate polymer material is used as an organic EL material. Polyparaphenylene vinylenes (PPVs), polyvinyl carbazoles (PVKs), and polyfluoranes can be given as typical polymer materials.

Note that there are several types of PPV organic EL materials, and materials recorded in Schenk, H., Becker, H., Gelled, O., Kluge, E., Crater, W., and Spreitzer, H., "Polymers for Light Emitting Diodes", Euro Display Proceedings, 1999, pp. 33–7, and in Japanese Patent Application Laid-open No. Hei 10-92576, for example, may be used. The entire disclosures of these article and patent are incorporated herein by reference.

As specific light emitting layers, cyano-polyphenylene vinylene may be used as a red light radiating luminescence layer, polyphenylene vinylene may be used as a green light radiating luminescence layer, and polyphenylene vinylene or polyalkylphenylene may be used as a blue light radiating luminescence layer. The film thicknesses may be between 30 and 150 nm (preferably between 40 and 100 nm).

However, the above example is one example of the organic EL materials which can be used as luminescence layers, and it is not necessary to limit use to these materials. An EL layer (a layer for emitting light and for performing carrier motion for such) may be formed by freely combining light emitting layers, electric charge transporting layers, and electric charge injecting layers.

For example, embodiment 4 shows an example of using a polymer material as a light emitting layer, but a low molecular weight organic EL material may also be used. Further, it is possible to use inorganic materials such as silicon carbide, as an electric charge transporting layer or an electric charge injecting layer. Known materials can be used for these organic EL materials and inorganic materials.

A laminar structure EL layer, in which a hole injecting layer 46 made from PEDOT (polythiophene) or PAni (polyaniline) is formed on the luminescence layer 45, is used in embodiment 4. An anode 47 is then formed on the hole injecting layer 46 from a transparent conducting film. The light generated by the light emitting layer 45 is radiated toward the upper surface (toward the top of the TFT) in embodiment 4, and therefore the anode must be transparent to light. An indium oxide and tin oxide compound, or an indium oxide and zinc oxide compound can be used for the transparent conducting film. However, because it is formed after forming the low heat resistance light emitting and hole injecting layers, it is preferable to use a material which can be deposited at as low a temperature as possible.

An EL element 3505 is complete at the point where the anode 47 is formed. Note that what is called the EL element 3505 here is formed by the pixel electrode (cathode) 43, the light emitting layer 45, the hole injecting layer 46, and the anode 47. The pixel electrode 43 is nearly equal in area to the pixel, and consequently the entire pixel functions as an EL device. Therefore, the light emitting efficiency is extremely high, and a bright image display becomes possible.

In addition, a second passivation film 48 is then formed on the anode 47 in embodiment 4. It is preferable to use a silicon nitride film or an oxidized silicon nitride film as the second passivation film 48. The purpose of this is the isolation of the EL element from the outside, and this is meaningful in preventing degradation due to oxidation of the organic EL material, and in controlling gaseous emitted from the organic EL material. The reliability of the EL display can thus be raised.

The EL display panel of embodiment 4 has a pixel portion made from pixels structured as in FIG. 11, and has a switching TFT with a sufficiently low off current value, and a EL driver control TFT which is strong with respect to hot carrier injection. An EL display panel having high reliability, and in which good image display is possible, can therefore be obtained.

Note that it is possible to implement the constitution of embodiment 4 by freely combining it with the constitutions of any of embodiments 1 to 3.

[Embodiment 5]

Figure 12:
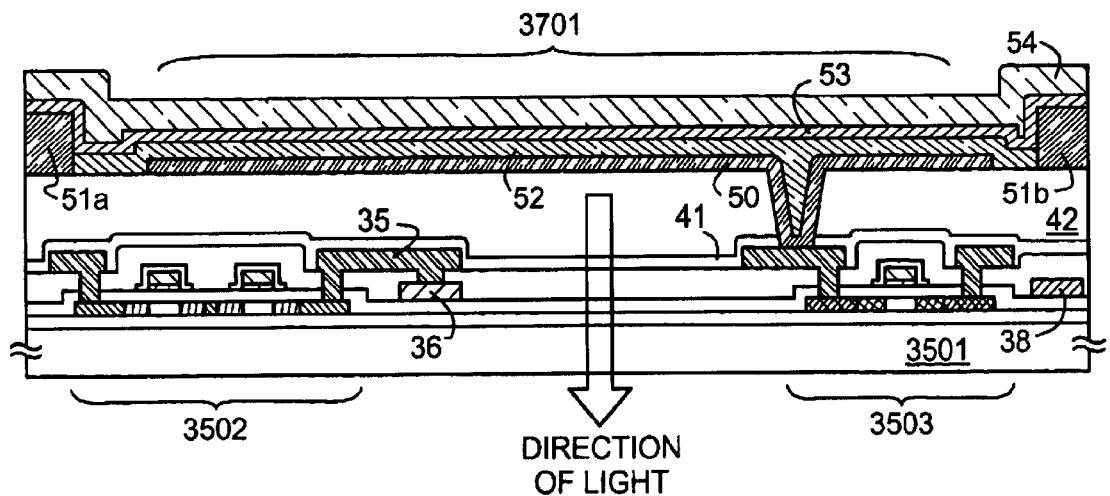
FIG. 12 is a schematic diagram of a cross sectional structure of an EL display of the present invention.

A structure in which the structure of the EL element 3505 in the pixel portion shown in embodiment 4 is inverted is explained in embodiment 5. FIG. 12 is used in the explanation. Note that the only points of difference between the structure of FIG. 12 and that of FIG. 11 is an EL element portion and an EL driver TFT, and therefore an explanation of other portions is omitted. Further, in order to simplify the explanation in embodiment 5, SRAM TFTs are not shown in the figures, but it is possible to use the same structure as that of a switching TFT and an EL driver TFT.

An EL driver TFT 3503 is a p-channel TFT in FIG. 12, and it can be manufactured using a known method.

A transparent conducting film is used as a pixel electrode (anode) 50 in embodiment 5. Specifically, a conducting film made from a compound of indium oxide and zinc oxide is used. Of course, a conducting film made from a compound of indium oxide and tin oxide may also be used.

After then forming banks 51a and 51b from insulating films, a light emitting layer 52 is formed from polyvinyl carbazole by solution coating. An electron injecting layer 53 is formed on the light emitting layer from potassium acetylacetonate (denoted acacK), and a cathode 54 is formed from an aluminum alloy. In this case the cathode 54 also functions as a passivation film. An EL element 3701 is thus formed.

The light generated by the light emitting layer 52 is radiated toward the substrate on which the TFT is formed in embodiment 5, as shown by the arrows.

Note that it is possible to implement the constitution of embodiment 5 by freely combining it with the constitution of any of embodiments 1 to 3.

[Embodiment 6]

The material used in the EL layer of the EL element in the EL display of the present invention is not limited to an organic EL material, and the present invention can be implemented using an inorganic EL material. However, at present inorganic EL materials have an extremely high driver voltage, and therefore TFTs which have voltage resistance characteristics such that they are able to withstand such a high voltage must be used.

Alternately, if an inorganic EL material having a lower driver voltage is developed in the future, it is possible to apply such a material to the present invention.

Furthermore, it is possible to freely combine the constitution of the present embodiment with the constitution of any of Embodiments 1 to 5.

[Embodiment 7]

In the present invention, an organic material used as an EL layer may be either a low molecular organic material or a polymer (high molecular) organic material. As the low molecular organic material, materials are known centering on Alq3 (tris-8-quinolylite-aluminum), TPD (triphenylamine derivative) or the like. As polymer organic material, π-cooperative polymer materials can be given. Typically, PPV (polyphenylenevynilene), PVK (polyvynilcarbazole), polycarbonate or the like can be given.

The polymer (high molecular) organic material can be formed with a simple thin film formation method such as the spin coating method (which is referred to also as solution application method), the dispense method, the printing method, the ink jet method or the like. The polymer organic material has a high heat endurance compared with the low molecular organic material.

Furthermore, in the case where the EL layer incorporated in the EL element incorporated in the EL display according to the present invention has an electron transport layer and a positive hole transport layer, the electron transport layer and the positive hole transport layer may be formed of inorganic material such as, for example, a non-crystal semiconductor formed of non-crystal Si or non-crystal Si1-xCx or the like.

In the non-crystal semiconductor, a large quantity of trap level is present, and at the same time, the non-crystal semiconductor forms a large quantity of interface levels at an interface at which the non-crystal semiconductor contacts other layers. As a consequence, the EL element can emit light at a low voltage, and at the same time, an attempt can be made to provide a high luminance.

Besides, a dopant (impurity) is added to the organic EL layer, and the color of light emission of the organic EL layer may be changed. These dopant includes DCM1, Nile red, lubren, coumarin 6, TPB and quinaquelidon.

Besides, the structure of the present embodiment may be combined freely with any of the structures in Embodiments 1 through 6.

[Embodiment 8]

In this embodiment, a description is shown in FIG. 13 to FIG. 16 given of a method of simultaneously manufacturing switching TFTs of a pixel portion, and an EL driving TFT and a SRAM TFT. Concerning the SRAM TFT, an n-channel TFT and a p-channel TFT that constitutes SRAM TFT is shown respectively in the figure, for a brief description. Further, the TFTs of a pixel portion and a driving circuit portion around the pixel portion can be formed simultaneously.

Figure 13A:
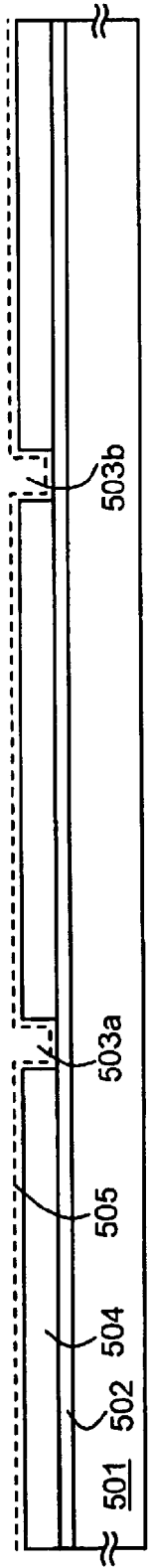
FIGS. 13A to 13E are diagrams showing a process of manufacturing an EL display of the present invention.

First, a substrate 501 in which a base film (not shown) is disposed on the surface thereof is prepared as shown in FIG. 13A. In this embodiment, a silicon nitride oxide film whose thickness is 200 nm and another silicon nitride oxide film whose thickness is 100 nm are laminated and are used as a base film on a crystallized glass. At this time, preferably, the concentration of nitrogen of the film contacting the crystallized glass substrate is kept to 10–25 wt %. It is possible to form an element directly on a quartz substrate without any base film.

Thereafter, an amorphous silicon film 502 whose thickness is 45 nm is formed on the substrate 501 by a well-known film formation method. There is no need to limit it to the amorphous silicon film. Instead, a semiconductor film (including a microcrystal semiconductor film) that has an amorphous structure can be used in this embodiment. A compound semiconductor film that has an amorphous structure, such as an amorphous silicon germanium film, also can be used herein.

Figure 13B:
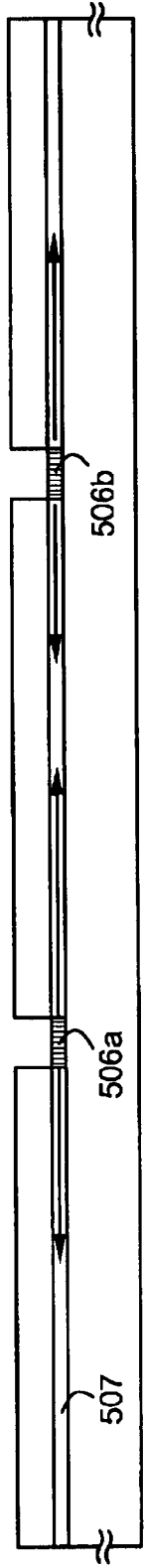
Figure 13C:
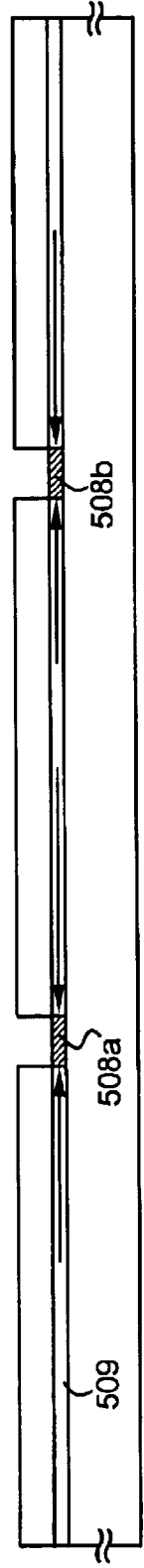
Figure 13D:

The steps from here to FIG. 13C can be understood with reference to Japanese Laid-open Patent Publication No. 247735 of 1998 filed by the present applicant. The entire disclosure of hte Japanese patent is incorporated herein by reference. This publication discloses a technique concerning a method of crystallizing a semiconductor film, which uses an element, such as Ni, as a catalyst.

First, a protective film 504 that has openings 503a and 503b is formed. A silicon oxide film 150 nm thick is used in this embodiment. A layer 505 (Ni containing layer) that contains nickel (Ni) is formed on the protective film 504 by a spin coating method. Concerning the formation of the Ni containing layer, reference can be made to the above publication.

Thereafter, as shown in FIG. 13B, heating processing at 570° C. for 14 hours is performed in an inert atmosphere, and the amorphous silicon film 502 is crystallized. At this time, crystallization progresses substantially in parallel with the substrate, starting from regions 506a and 506b (hereinafter, designated as Ni addition region) with which Ni is in contact. As a result, a polysilicon film 507 is formed that has a crystal structure in which bar crystals gather and form lines.

Thereafter, as shown in FIG. 13C, an element (phosphorus preferably) that belongs to 15-family is added to the Ni addition regions 506a and 506b, while leaving the protective film 504 as a mask. Regions 508a and 508b (hereinafter, designated as phosphorus addition region) to which phosphorus was added at high concentration are thus formed.

Thereafter, heat processing at 600° C. for 12 hours is performed in an inert atmosphere as shown in FIG. 13C. Ni existing in the polysilicon film 507 is moved by this heat processing, and almost all of them are finally captured by the phosphorus addition regions 508a and 508b as shown by the arrow. It is thought that this is a phenomenon caused by the gettering effect of a metallic element (Ni in this embodiment) by phosphorus.

By this process, the concentration of Ni remaining in the polysilicon film 509 is reduced to at least $2\times10^{17}$ atoms/cm$^3$ according to the measurement value by SIMS (mass secondary ion analysis). Although Ni is a lifetime killer for a semiconductor, no adverse influence is given to the TFT characteristic when it is decreased to this extent. Additionally, since this concentration is the measurement limit of the SIMS analysis in the current state of the art, it will show an even lower concentration (less than $2\times10^{17}$ atoms/cm$^3$) in practice.

Figure 13E:

The polysilicon film 509 can be thus obtained that is crystallized by a catalyst and is decreased to the level in which the catalyst does not obstruct the operation of a TFT. Thereafter, active layers 510–513 that use the polysilicon film 509 only are formed by a patterning process. At this time, a marker to conduct mask alignment in the following patterning should be formed by using the above polysilicon film. (FIG. 13D) Thereafter, a silicon nitride oxide film 50 nm thick is formed by the plasma CVD method as shown in FIG. 13E, heating processing at 950° C. for 1 hour is then performed in an oxidation atmosphere, and a thermal oxidation process is performed. The oxidation atmosphere can be an oxygen atmosphere or another oxygen atmosphere in which halogen is added.

In this thermal oxidation process, the oxidation progresses in the interface between the active layer and the silicon nitride oxide film, and a polysilicon film whose thickness is about 15 nm is oxidized, so that a silicon oxide film whose thickness is about 30 nm is formed. That is, a gate insulating film 514 of a thickness of 80 nm is formed in which the silicon oxide film 30 nm thick and the silicon nitride oxide film 50 nm thick are laminated. The film thickness of the active layers 510–513 is made 30 nm by the thermal oxidation process.

Figure 14A:
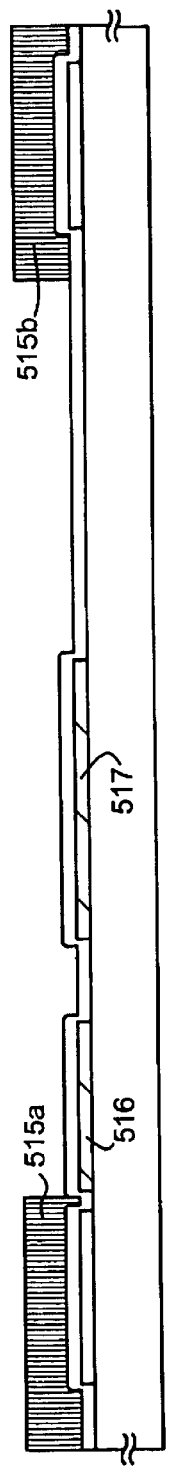
FIGS. 14A to 14D are diagrams showing the process of manufacturing the EL display device of the present invention.

Thereafter, as shown in FIG. 14A, resist masks 515a and 515b are formed, and an impurity element (hereinafter, designated as p-type impurity element) that gives the p-type through the medium of the gate insulating film 514 is added. As the p-type impurity element, an element that belongs to 13 group elements representatively, boron or gallium typically, can be used. This (called a channel doping process) is a process for controlling the threshold voltage of a TFT.

In this embodiment, boron is added by the ion doping method in which plasma excitation is performed without the mass separation of diborane (B$_2$H$_6$). The ion implantation method that performs the mass separation can be used, of course. According to this process, impurity regions 516 and 517 are formed that includes boron at the concentration of $1\times10^{15}$–$1\times10^{18}$ atoms/cm$^3$ ($5\times10^{16}$–$5\times10^{17}$ atoms/cm$^3$ representatively).

Figure 14B:
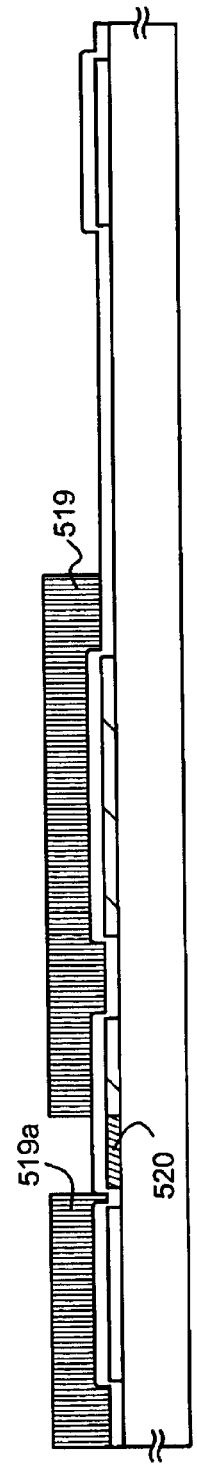

Thereafter, resist masks 519a and 519b are formed as shown in FIG. 14B, and an impurity element (hereinafter, designated as n-type impurity element) that gives the n-type through the medium of the gate insulating film 514 is added. As the n-type impurity element, an element that belongs to 15 group elements representatively, phosphorus or arsenic typically can be used. In this embodiment, a plasma doping method in which plasma excitation is performed without the mass separation of phosphine (PH3) is used. Phosphorus is added in the concentration of $1\times10^{18}$ atoms/cm$^3$. The ion implantation method that performs mass separation can be used, of course.

A dose amount is adjusted so that the n-type impurity element is included in the n-type impurity regions 520 formed by this process at the concentration of $2\times10^{16}$–$5\times10^{19}$ atoms/cm$^3$ ($5\times10^{17}$–$5\times10^{18}$ atoms/cm$^3$ representatively).

Figure 14C:
Figure 14D:
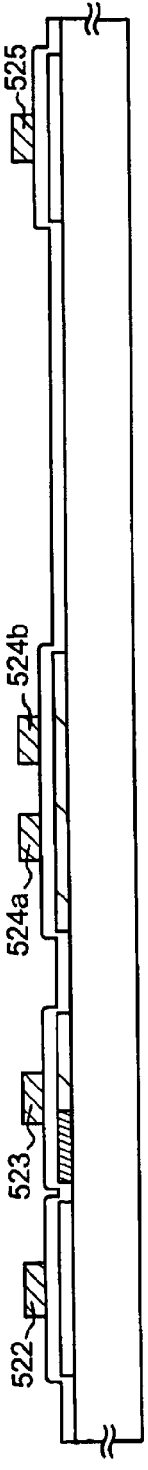

Thereafter, a process is performed for activating the added n-type impurity element and the added p-type impurity element as shown in FIG. 14C. There is no need to limit the activation means, but, since the gate insulating film 514 is disposed, the furnace annealing process that uses an electrothermal furnace is desirable. Additionally, it is preferable to perform heat processing at a temperature as high as possible because there is a possibility of having damaged the interface between the active layer and the gate insulating film of a part that is a channel formation region in the process of FIG. 14A.

Since the crystallized glass with high heat resistance is used in this embodiment, the activating process is performed by the furnace annealing processing at 800° C. for 1 hour.

The thermal oxidation can be performed keeping a processing atmosphere in an oxidizing atmosphere, or the heat processing can be performed in an inert atmosphere.

This process clarifies the edge of the n-type impurity regions 520 namely, the boundary (junction) between the n-type impurity regions 520 and the region (p-type impurity region formed by the process of FIG. 14A) around the n-type impurity regions 520 where the n-type impurity element is not added. This means that the LDD region and the channel formation region can form an excellent junction when a TFT is later completed.

Thereafter, a conductive film 200–400 nm thick is formed, and patterning is performed, so that gate electrodes 522–525 are formed. The length of each TFT channel is decided by the line width of those gate electrodes 522–525.

The gate electrode can be made of a conductive film of a single-layer, however, preferably, a lamination film, such as two-layer or three-layer film is used when necessary. A known conductive film can be used as the material of the gate electrode. Specifically, the film which can be used are films made of an element selected from the group consisting of tantalum (Ta), titanium (Ti), molybdenum (Mo), tungsten (W), chrome (Cr), and silicon (Si) having conductivity; a film of a nitride of the aforementioned elements (tantalum nitride film, tungsten nitride film, or titanium nitride film representatively); an alloy film of a combination of the aforementioned elements (Mo—W alloy or Mo—Ta alloy representatively); or, a silicide film of the aforementioned elements (tungsten silicide film or titanium silicide film representatively). They can have a single-layer structure or a lamination-layer structure, of course.

In this embodiment, a lamination film is used that is made of a tungsten nitride (WN) film 50 nm thick and a tungsten (W) film 350 nm thick. This can be formed by the sputtering method. By adding an inert gas, such as Xe or Ne, as a sputtering gas, the film can be prevented from peeling off because of stress.

At this time, the gate electrodes 523 are formed to overlap with part of the n-type impurity regions 520 respectively, with the gate insulating film 514 therebetween. The overlapping part is later made an LDD region overlapping with the gate electrode. According to the sectional view of the figure, the gate electrodes 524a and 524b are seen as separate, in fact, they are connected electrically to each other. Further the gate electrode 522 and 523 are seen as separate, in fact, they are connected electrically to each other.

Figure 15A:
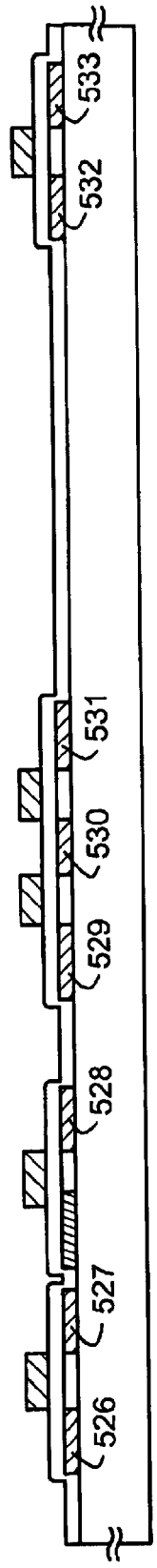
FIGS. 15A to 15D are diagrams showing the process of manufacturing the EL display device of the present invention.

Thereafter, with the gate electrodes 522–525 as masks, an n-type impurity element (phosphorus in this embodiment) is added self-adjustably, as shown in FIG. 15A. At this time, an adjustment is performed so that phosphorus is added to the thus formed impurity regions 526–533 at the concentration of ½–1/10 (⅓–¼ representatively) of that of the n-type impurity regions 520. Practically, the concentration is $1 \times 10^{16}$–$5 \times 10^{18}$ atoms/cm$^3$ ($3 \times 10^{17}$–$3 \times 10^{18}$ atoms/cm$^3$ typically).

Figure 15B:
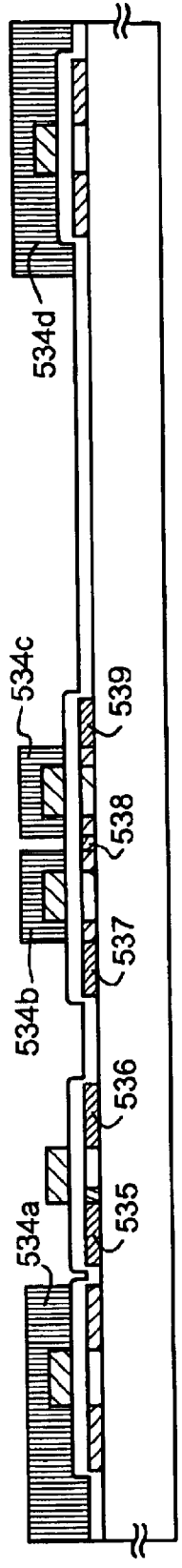

Thereafter, as shown in FIG. 15B, resist masks 534a–534d are formed to cover the gate electrode, an n-type impurity element (phosphorus in this embodiment) is then added, and impurity regions 535–539 including a high concentration of phosphorus are formed. The ion doping method using phosphine (PH3) is applied also herein, and an adjustment is performed so that the concentration of phosphorus in these regions is $1 \times 10^{20}$–$1 \times 10^{21}$ atoms/cm$^3$ ($2 \times 10^{20}$–$5 \times 10^{21}$ atoms/cm$^3$ representatively).

A source region or a drain region of the n-channel type TFT is formed through this process, and the switching TFT leaves a part of the n-type impurity regions 528–531 formed in the process of FIG. 15A. The leaving part comes to an LDD region of the switching TFT.

Figure 15C:
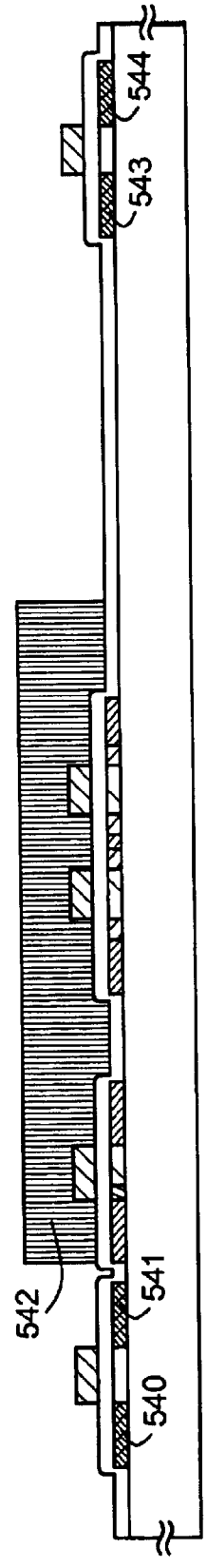

Thereafter, as shown in FIG. 15C, the resist masks 534a–534d are removed, and a resist mask 542 is newly formed. A p-type impurity element (boron in this embodiment) is then added, and impurity regions 540, 541, 543 and 544 including a high concentration of boron are formed. Herein, according to the ion dope method using diborane ($B_2H_6$), boron is added to obtain a concentration of $3 \times 10^{20}$–$3 \times 10^{21}$ atoms/cm$^3$ ($5 \times 10^{20}$–$1 \times 10^{21}$ atoms/cm$^3$ representatively).

Phosphorus has been already added to the impurity regions 540, 541, 543 and 544 at a concentration of $1 \times 10^{20}$–$1 \times 10^{21}$ atoms/cm$^3$. Boron added herein has at least three times as high concentration as the added phosphorus. Therefore, the impurity region of the n-type formed beforehand is completely changed into that of the p-type, and functions as an impurity region of the p-type.

Figure 15D:
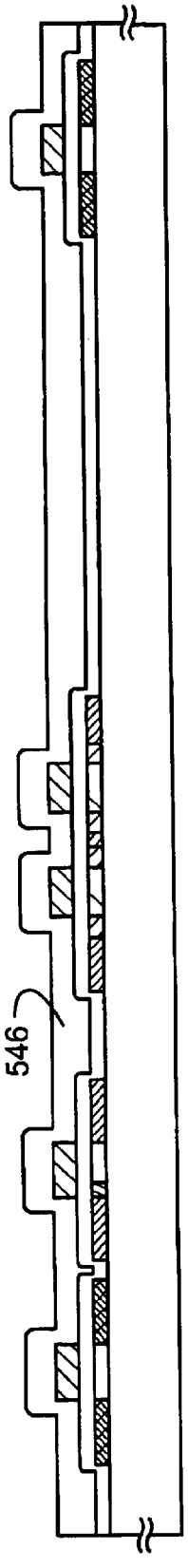

Thereafter, as shown in FIG. 15D, the resist mask 542 is removed, and then a first interlayer insulating film 546 is formed. As the first interlayer insulating film 546, an insulating film that includes silicon is used in the form of a single-layer structure or a stacked-layer structure as a combination thereof. Preferably, the film thickness thereof is 400 nm–1.5 μm. In this embodiment, a structure is created in which an 800 nm-thick silicon oxide film is stacked on a 200 nm-thick silicon nitride oxide film.

Thereafter, the n-type or p-type impurity element added at each concentration is activated. The furnace annealing method is desirable as an activation means. In this embodiment, heat treatment is performed at 550° C. for 4 hours in a nitrogen atmosphere in an electro-thermal furnace.

Heat treatment is further performed at 300–450° C. for 1–12 hours in an atmosphere that includes hydrogen of 3–100% for hydrogenation. This is a process to hydrogen-terminate unpaired bonds of a semiconductor film by thermally excited hydrogen. As another means for hydrogenation, plasma hydrogenation (hydrogen excited by plasma is used) can be performed.

Hydrogenation can be performed during the formation of the first interlayer insulating film 546. In more detail, the 200 nm-thick silicon nitride oxide film is formed, and hydrogenation is performed as mentioned above, and thereafter the remaining 800 nm-thick silicon oxide film can be formed.

Thereafter, as shown in FIG. 16A, contact holes are made in the first interlayer insulating film 546, and source lines 547–550 and drain wiring lines 551–553 are formed. In this embodiment, this electrode is formed with a lamination film of a three-layer structure in which a 100 nm-thick Ti film, a 300 nm-thick aluminum film that includes Ti, and a 150 nm-thick Ti film are continuously formed according to the sputtering method. Other conductive films can be used, of course.

Thereafter, a first passivation film 554 is formed to be 50–500 nm thick (200–300 nm thick representatively). In this embodiment, a 300 nm-thick silicon nitride oxide film is used as the first passivation film 554. A silicon nitride film can be substituted for this.

At this time, it is effective to perform plasma treatment by the use of gas that includes hydrogen, such as $H_2$ or $NH_3$, prior to the formation of the silicon nitride oxide film. Hydrogen excited by this preprocess is supplied to the first interlayer insulating film 546, and, through heat treatment, the film quality of the first passivation film 554 is improved.

At the same time, since hydrogen that is added to the first interlayer insulating film 546 diffuses onto the lower side, the active layer can be effectively hydrogenated.

Thereafter, as shown in FIG. 16B, a second interlayer insulating film 555 made of organic resin is formed. Polyimide, acrylic fiber, or BCB (benzocyclobutene) can be used as the organic resin. Especially, since the second interlayer insulating film 555 is required to flatten the level differences formed by TFTs, an acrylic film excellent in smoothness is desirable. An acrylic film is formed to be 2.5 μm thick in this embodiment.

Thereafter, contact holes that reach the drain wiring line 553 are made in the second interlayer insulating film 555 and the first passivation film 554, and then a pixel electrode (anode) 556 is formed. In this embodiment, the indium tin oxide film (ITO) is formed as a pixel electrode by forming to be 110 nm thick and patterned. A transparent conductive film can be used in which zinc oxide (ZnO) of 2–20% is mixed with indium tin oxide film also can be used. This pixel electrode is an anode of an EL element 203.

Thereafter, an insulating film (a silicon oxide film in this embodiment) that includes silicon is formed to be 500 nm thick, an opening is then formed at the position corresponding to the pixel electrode 556, and a third interlayer insulating film 557 is formed. It is possible to easily form a tapered sidewall by using the wet etching method when the opening is formed. If the sidewall of the opening does not have a sufficiently gentle slope, deterioration of the EL layer caused by level differences will lead to an important problem.

Next, the EL layer 558 and the cathode (MgAg electrode) 559 are formed using the vacuum deposition method without air release. The thickness of the EL layer is 80–200 nm (100–120 nm typically); the cathode 559 thereof is 180–300 nm (200–250 nm typically).

In this process, an EL layer and cathode are sequentially formed for a pixel corresponding to red, a pixel corresponding to green, and a pixel corresponding to blue. However, since the EL layer is poor in tolerance to solutions, they must be independently formed for each color without using the photolithography technique. Thus, it is preferable to mask pixels except a desired one by the use of the metal mask, and selectively form an EL layer for the desired pixel.

A known material can be used for the EL layer 558. Preferably, that is an organic material in consideration of driving voltage. For example, the EL layer can be formed with a four-layer structure consisting of a positive hole injection layer, a positive hole transporting layer, a luminescent layer, and an electronic injection layer. In this embodiment, an example of using MgAg electrode as a cathode of an EL element 203, although other well-known material also can be used.

As a protective electrode 560, the conductive layer, which contains aluminum as a main component, can be used. The protective electrode 560 is formed using a vacuum deposition method with another mask when forming the EL layer and the cathode. Further, the protective electrode is formed continually without air release after forming the EL layer and the cathode.

Lastly, a second passivation film 561 made of a silicon nitride film is formed to be 300 nm thick. Practically, a protective electrode 560 fills the role of protecting the protect EL layer from water. Furthermore, the reliability of an EL element 203 can be improved by forming the second passivation film 561.

An active matrix type EL display device constructed as shown in FIG. 16C is completed. The device is composed of a switching TFT 201, an EL driving TFT 202, a SRAM n-channel type 204 and SRAM p-channel type TFT 205.

In practice, preferably, the device is packaged (sealed) by a highly airtight protective film (laminate film, ultraviolet cured resin film, etc.) or a housing material such as a ceramic sealing, in order not to be exposed to the air after the structure is completed as shown in FIG. 16C.

The present embodiment can be freely combined with an embodiment 1–3, 6 and 7.

[Embodiment 9]

A detailed structure of the source signal side driver circuit 102 shown by FIG. 1 is explained in embodiment 9. A circuit diagram of an example of a source signal side driver circuit used in embodiment 9 is shown in FIG. 21.

Figure 21:
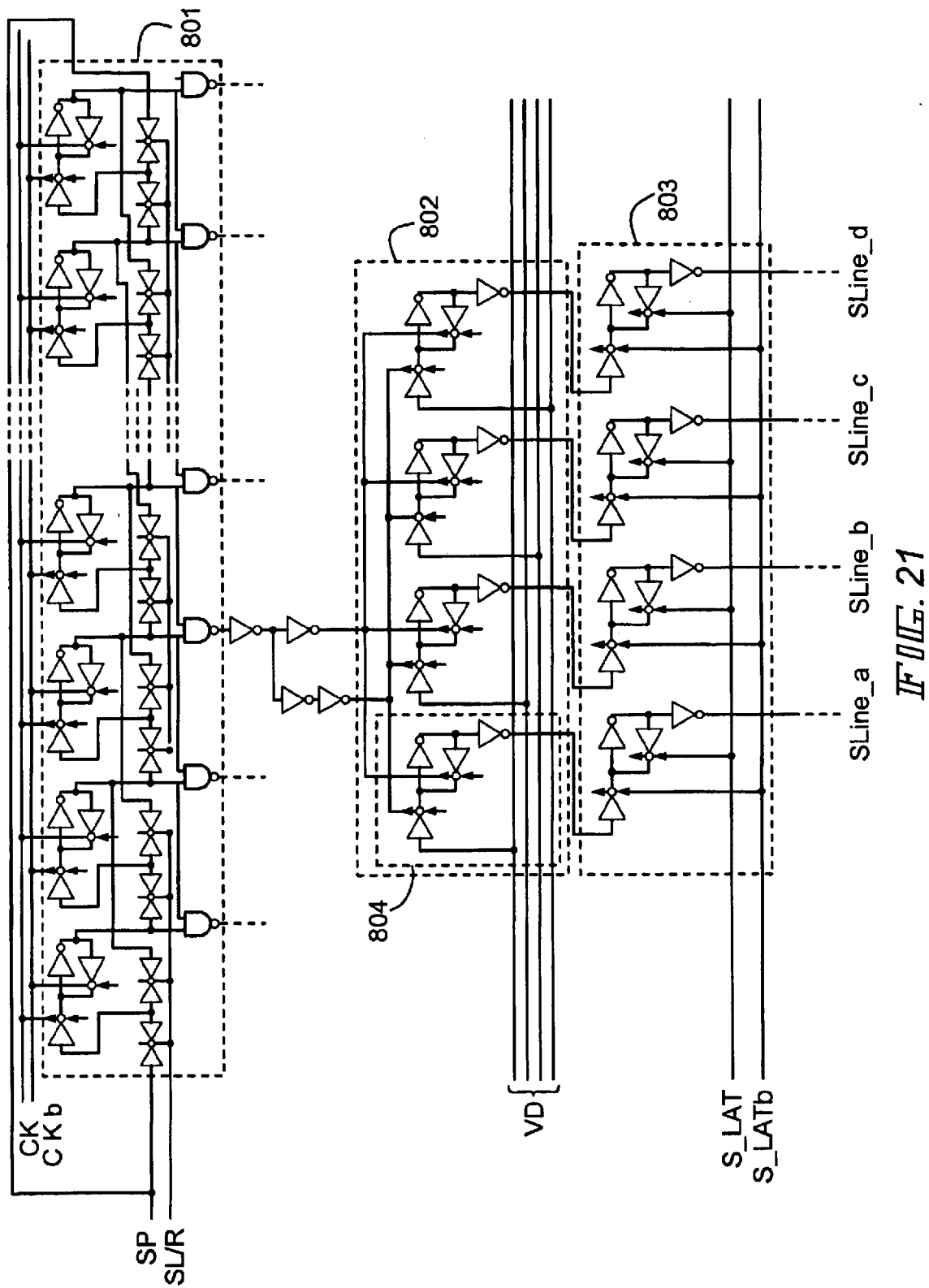
FIG. 21 is a circuit diagram of a source signal side driver circuit used by the present invention.

Shift registers 801, latches (A) 802, and latches (B) 803 are arranged as shown in FIG. 21. Note that one group of the latches (A) 802 and the latches (B) 803 corresponds to four source signal lines SLine_a to Sline_d in embodiment 1. Further, a level shifter for changing the width of the amplitude of the signal voltage is not formed in embodiment 9, but it may also be suitably formed by a designer.

A clock signal CK, a clock signal CKb in which the polarity of CK is inverted, a start pulse SP, and a driver direction changeover signal SL/R are each input to the shift registers 801 by wirings shown in FIG. 21. Further, a digital data signal VD input from the outside is input to the latches (A) 802 by wirings shown in FIG. 21. A latch signal S_LAT and a signal S_LATb, in which the polarity of S_LAT is inverted, are input to the latches (B) 803 by wirings shown in FIG. 21.

Regarding a detailed structure of the latches (A) 802, an example of a portion 804 of the latches (A) 802 which store the digital data signal corresponding to the source signal line SLine_a is explained. The portion 804 of the latches (A) 802 has two clocked inverters and two inverters.

Figure 22:
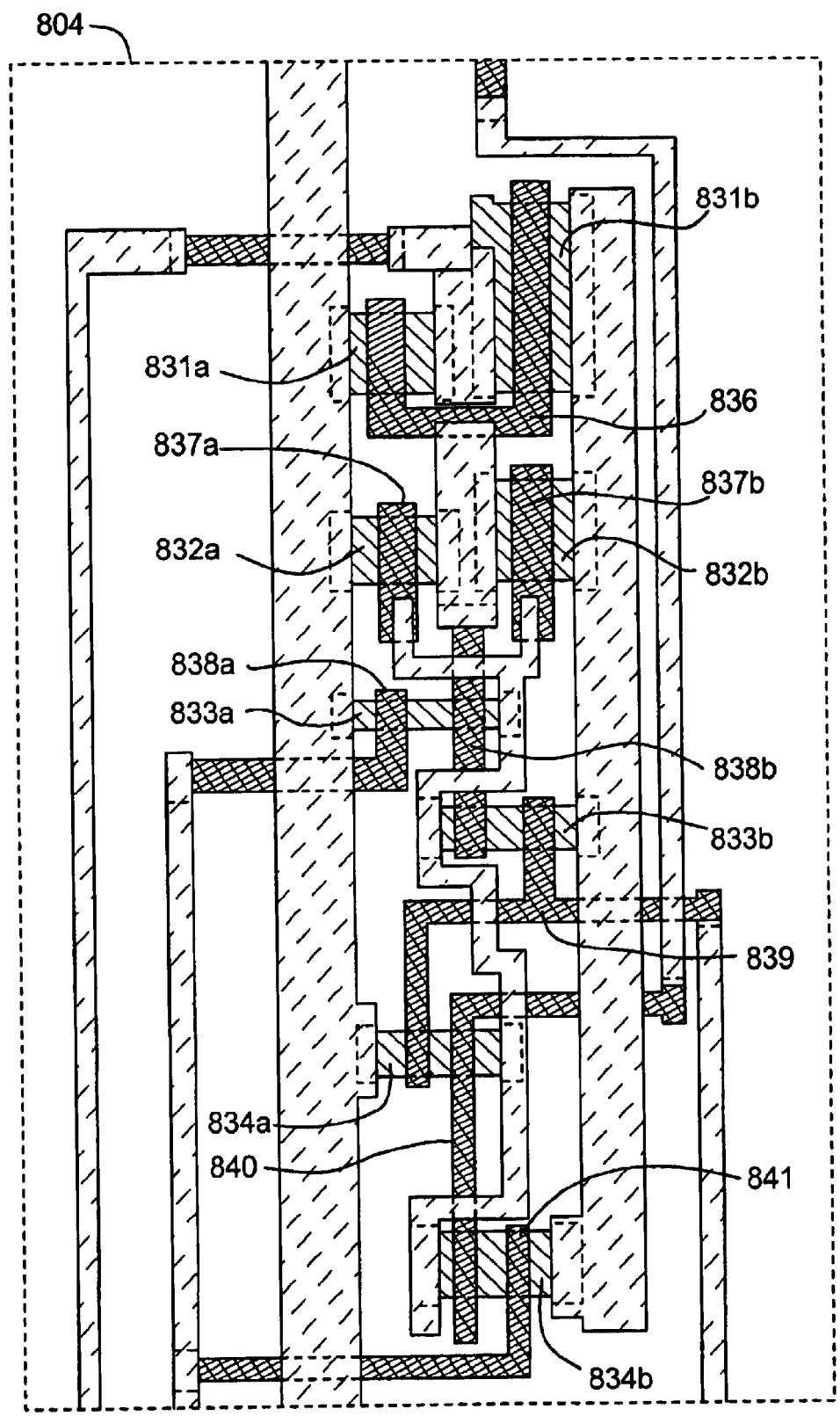
FIG. 22 is a top view of a latch circuit used by the present invention.

A top view of the portion 804 of the latches (A) 802 is shown in FIG. 22. Reference numerals 831a and 831b each denotes an active layer of a TFT forming one inverter of the portion 804 of the latches (A) 802, and reference numeral 836 denotes a common gate electrode of the TFT forming one inverter. Further, reference numerals 832a and 832b each denotes an active layer of another TFT forming one inverter of the portion 804 of the latches (A) 802, and references numerals 837a and 837b denote gate electrodes formed on the active layers 832a and 832b, respectively. Note that the gate electrodes 837a and 837b are electrically connected.

Reference numerals 833a and 833b each denotes an active layer of a TFT forming one clock inverter of the portion 804 of the latches (A). Gate electrodes 838a and 838b are formed on the active layer 833a, becoming a double gate structure. Further, gate electrodes 838b and 839 are formed on the active layer 833b, becoming a double gate structure.

Reference numerals 834a and 834b each denotes an active layer of a TFT forming another clocked inverter of the portion 804 of the latches (A) 802. Gate electrodes 839 and 840 are formed on the active layer 834a, becoming a double gate structure. Further, gate electrodes 840 and 841 are formed on the active layer 834b, becoming a double gate structure.

It is possible to implement the constitution of embodiment 9 by freely combining it with the constitutions of any of embodiments 1 to 8.

[Embodiment 10]

Another method of driving the EL display of the present invention shown in FIGS. 1 to 4 is explained next. A case of performing $2^n$ gradation display in accordance with a n-bit digital driving method is explained. Note that a timing chart is the same as that of the embodiment mode, and therefore FIG. 5 may be referred to.

First, one frame period is partitioned into n subframe periods (SF1 to SFn). Note that a period for all pixels of a pixel portion to display one image is referred to as one frame period (F). The oscillation frequency of a normal EL display is equal to or greater than 60 Hz, namely 60 or more frame periods are formed during one second, and 60 or more images are displayed in one second. If the number of images displayed during one second becomes fewer than 60, then problems such as an image flicker start to become visually conspicuous. Note that a plurality of periods into which one frame period is additionally partitioned is referred to as subframe periods. As the number of gradations increases, the number of frame period partitions also increases, and the driver circuit must be driven at a higher frequency.

One subframe period is divided into a write-in period (Ta) and a display period (Ts). The write-in period is a period for inputting a digital data signal into all of the pixels during one subframe period. The display period (also referred to as a turn on period) denotes a period for determining whether an EL element emits light or does not emit light, and for performing display.

The lengths of write-in periods (Ta1 to Tan) of the n subframe periods (SF1 to SFn), respectively, is all constant. The display periods (Ts) of each of the subframe periods (SF1 to SFn) become display periods (Ts1 to Tsn).

The length of the display periods is set so as to become Ts1: Ts2: Ts3: . . . : Ts(n-1): Tsn=$2^0$: $2^{-1}$ : $2^{-2}$: . . . : $2^{-(n-2)}$: $2^{-(n-1)}$. Note that SF1 to SFn may appear in any order. A desired gradation display, from among the $2^n$ gradations, can be performed by combining the display periods.

First, the electric potential of the opposing electrode (the opposing electric potential) is maintained at the same level as the electric potential of the electric power supply lines (V1 to Vx) in the write-in period. The opposing electric potential may be the same as that of the electric power supply potential, in a range in which the EL elements do not emit light. Note that the electric power supply potential is maintained at a constant voltage at all times. Further, the electric potential difference between the opposing electric potential and the electric power supply potential is referred to as an EL driver voltage in this specification. It is preferable that the EL driver voltage is 0 V during the write-in period, but it may be having any size on the order at which the EL elements do not emit light.

The gate signal line G1 is selected in accordance with the gate signal input to the gate signal line G1. Therefore, all of the switching TFTs 105 whose gate electrode is connected to the gate signal line G1 are placed in the on state. The digital data signal is then input simultaneously to all of the source signal lines (S1 to Sx). The digital data signal has "0" or "1" information, and the "0" and "1" digital data signals denote signals having voltages which are one of "Hi" or respectively.

The digital data signal input to the source signal lines (S1 to Sx) is then input to the SRAM 108 as Vin, through the on state switching TFT 105, and stored. Note that the digital data signal input to the SRAM is referred to as an input digital data signal.

Next, all of the switching TFTs 105 connected to a gate signal line G2 are placed in an on state in accordance with the gate signal input to the gate signal line G2. The digital data signal is then input to the source signal lines (S1 to Sx) in order.

The digital data signal input to the source signal lines (S1 to Sx) is then input to the SRAM 108 as Vin, through the on state switching TFT 105, and stored.

The gate signal lines G3 to Gy are also selected in order by the gate signals, and the above operations are repeated. The digital data signal is therefore input to all of the pixels, and the input digital data signal is stored in each pixel. The period until the digital data signal is input to all of the pixels is the write-in period.

The display period begins at the same time that the write-in period is complete. All of the switching TFTs 105 are placed in the off state as the display period begins. The opposing electric potential then has an electric potential difference to the electric power supply potential at a level in which the EL elements emit light.

The digital data signal stored in the SRAM 108 is output from the SRAM 108 as Vout. The digital data signal output from the SRAM as Vout is referred to as an output digital data signal. The output digital data signal is a signal in which the input digital data signal is inverted, and the output digital data signal is input to the gate electrode of the EL driver TFT 109.

When the input digital data signal has "1" information, the output digital data signal will then contain "0" information. If the output digital data signal containing "0" information is input to the gate electrode of the EL driver TFT 109, then the EL driver TFT 109 will be placed into the off state in this embodiment mode. The electric potential of the pixel electrode of the EL element 111 is therefore maintained at the same electric potential as the opposing electric potential. As a result, the EL element 111 of a pixel to which the digital data signal containing "1" information is applied will not emit light.

Conversely, when the input digital data signal has "0" information, the output digital data signal will then contain "1" information. If the output digital data signal containing "1" information is input to the gate electrode of the EL driver TFT 109, then the EL driver TFT 109 will be placed into the on state in this embodiment mode. The electric potential of the pixel electrode of the EL element 111 is therefore maintained at the electric power supply potential. Further, during the display period the opposing electric potential has an electric potential difference to the electric power supply potential at which level in which the EL elements emit light. As a result, the EL element 111 of a pixel to which the digital data signal containing "0" information is applied will emit light.

The light emitting state or the non-light emitting state of the EL elements is thus selected in accordance with the information of the digital data signal, and display is performed by all of the pixels simultaneously. An image is formed in accordance with all of the pixels performing display. The period in which the pixels perform display is referred to as the display period.

The display period is any period from Ts1 to Tsn. Predetermined pixels are turned on for the Tsn period here.

The write-in period again begins, and after the data signal is input to all of the pixels, the display period begins. Any of the periods Ts1 to Ts(n-1) becomes the display period at this point. Predetermined pixels are turned on during the Ts(n-1) period here.

Similar operations are repeated in the remaining n-2 subframe periods, Ts(n-2), Ts(n-3), . . . , and Ts1 are set, in order, to be the display period, and predetermined pixels are turned on in the respective subframe periods.

One frame period is complete after the appearance of the n subframe periods. By adding up the lengths of the display periods in which the pixel is turned on, the gradation of that pixel is determined. For example, when n=8, and the brightness for a case of the pixel emitting light during all of the display periods is taken as 100%, when the pixel emits light in Ts1 and Ts2, then a brightness of 75% can be expressed, and when Ts3, Ts5, and Ts8 are selected, a brightness of 16% can be expressed.

Note that, in embodiment 10, a constant electric power supply potential is always maintained for the EL display, and that by changing the opposing electric potential in accordance with changing the write-in period and the display period, and by changing the size of the EL driver voltage, the light emission of the EL elements is controlled. However, the present invention is not limited to this structure. In the EL display of the present invention, the opposing electric potential may always be maintained at a constant level, and the electric potential of the pixel electrodes may be changed. In other words, contrasting with the case of embodiment 10, the electric potential of the opposing electrode may be always maintained at a constant, and by changing the electric power supply potential in accordance with changing the write-in period and the display period, and by changing the size of the EL driver voltage, the light emission of the EL elements may be controlled.

Further, the opposing electric potential is maintained at the same electric potential as the electric power supply potential during the write-in period in the embodiment mode, and therefore the EL elements do not emit light. However, the present invention is not limited to this structure. By always forming an electric potential difference between the opposing electric potential and the electric power supply potential at the level in which the EL element emits the light, display may also be similarly performed in the write-in period as well as the display period. However, in this case the entire subframe period in practice becomes a period in which light is emitted, and therefore the lengths of the subframe periods are set so as to become SF1: SF2 : SF3: . . . : SF(n-1): SFn=20: $2^{-1}$: 2-2: . . . : $2^{-(n-2)}$: $2^{-(n-1)}$. Compared to the driving method in which light is not emitted during the write-in period, an image having a high, brightness can be obtained in accordance with the above structure.

Furthermore, it is possible to combine the constitution of embodiment 10 with the constitutions of any of embodiments 1 to 9.

[Embodiment 11]

The EL display device (EL module) formed by performing the present invention is superior to a liquid crystal display device in visibility in bright places because of its self-luminous properties. Therefore, the present invention can be used as a display portion of a direct-view type EL display (indicating a display equipped with an EL module). As the EL display, there is a personal computer monitor, a TV receiving monitor, an advertisement display monitor, and so on.

The present invention can be operated to all electronic equipment that includes displays as constituent parts, including the aforementioned EL display.

As the electronic equipment, there are an EL display, video camera, digital camera, head mounted type display, car-navigator, personal computer, portable information terminal (mobile computer, mobile phone, electronic book, etc.), and picture reproducer provided with recording media (specifically, device which can reproduce a recording medium and equip a display capable of displaying the image such as compact disk (CD), laser disc (LD), or digital video disc (DVD)). Examples of the electronic equipment are shown in FIG. 17.

Figure 17A:
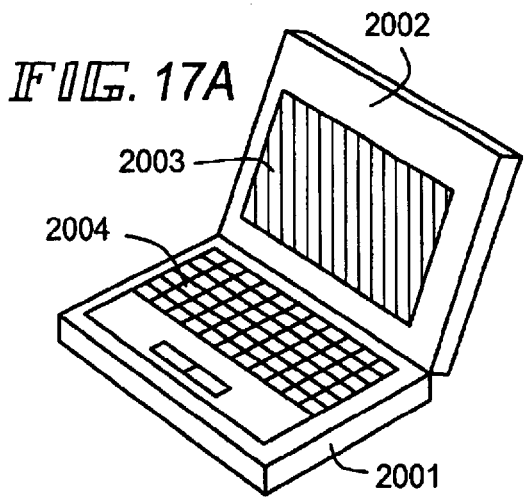
FIGS. 17A to 17E are electronic equipment using an EL display of the present invention.

FIG. 17A depicts a personal computer, which includes a main body 2001, case 2002, display portion 2003, and keyboard 2004. The present invention can be used as the display device 2003 of a personal computer.

Figure 17B:
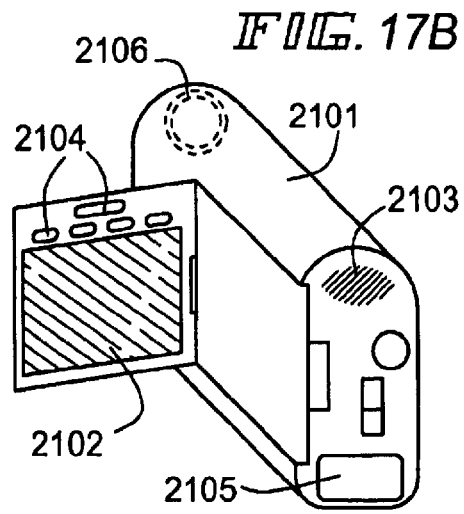

FIG. 17B depicts a video camera, which includes a main body 2101, display device 2102, voice-inputting portion 2103, operation switch 2104, battery 2105, and image reception portion 2106. The present invention can be used as the display device 2102.

Figure 17C:
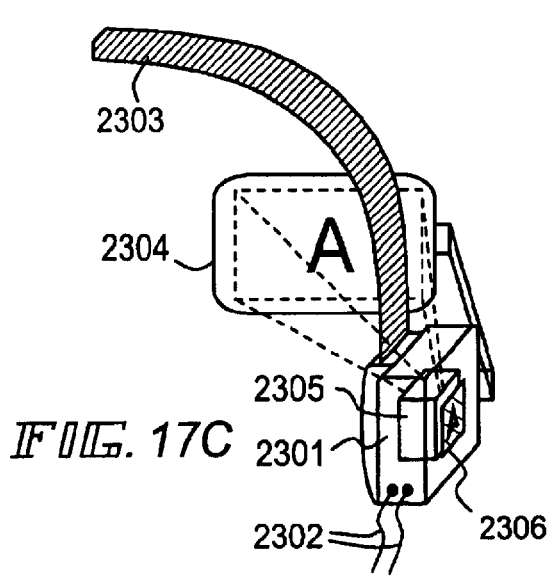

FIG. 17C depicts a part of a head mounted type EL display (right side), which includes a main body 2301, signal cable 2302, head fixation band 2303, display monitor 2304, optical system 2305, and display device 2306. The present invention can be used as the display device 2306.

Figure 17D:
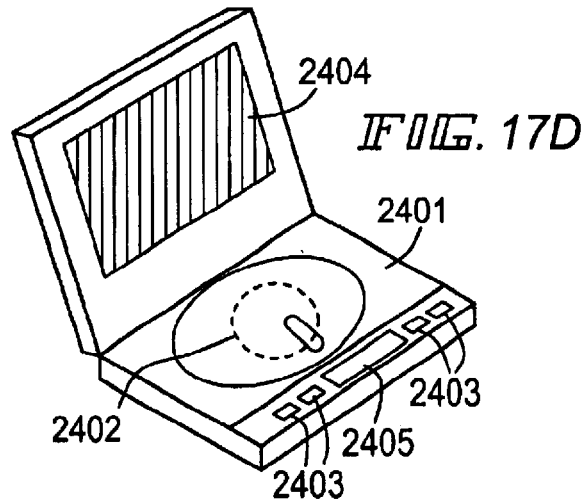

FIG. 17D depicts a picture reproducer (specifically, DVD reproducing player) provided with recording media, which includes a main body 2401, recording medium 2402 (CD, LD, DVD, etc.), operation switch 2403, display device (a) 2404, and display device (b) 2405. The display device (a) chiefly displays image information, and the display device (b) chiefly displays character information. The present invention can be used as the display devices (a) 2404 and (b) 2405. The present invention is applicable to a CD player or a game machine as a picture reproducer provided with recording media.

Figure 17E:
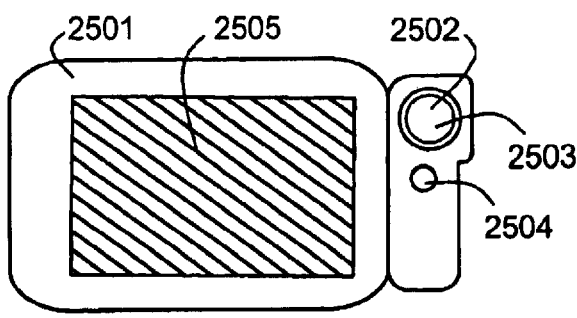
Figure 18:
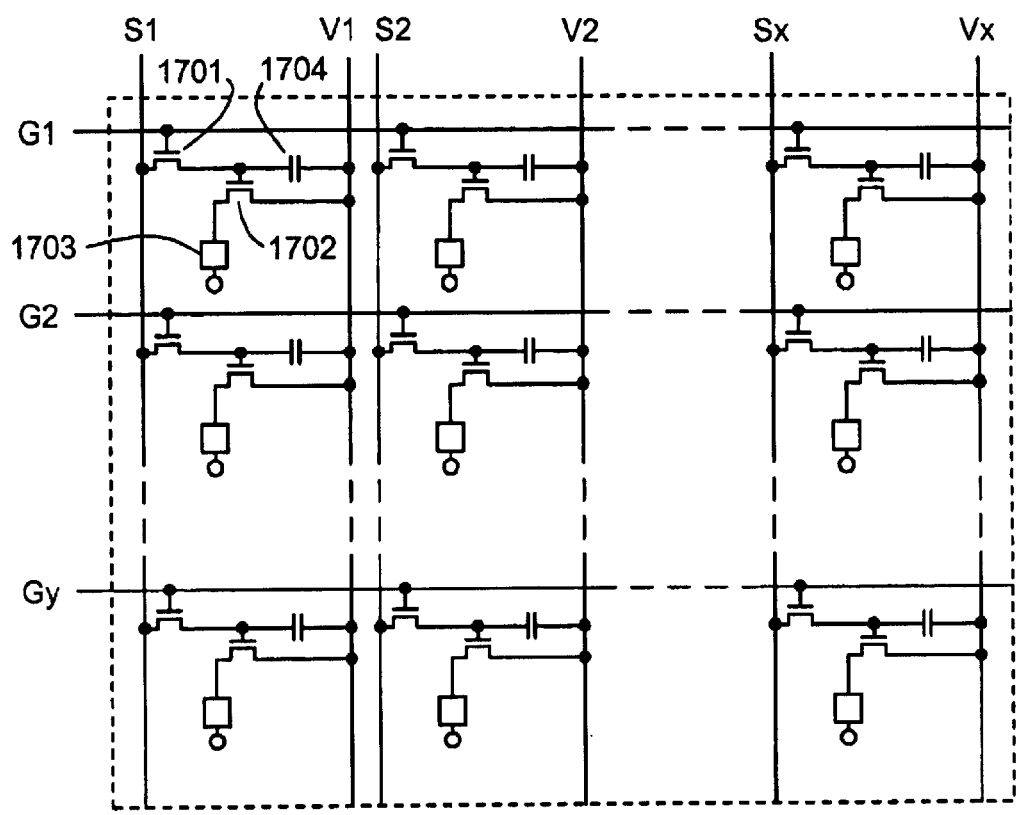
FIG. 18 is a circuit diagram of a pixel portion of a conventional EL display.

FIG. 17E depicts a portable (mobile) computer, which includes a main body 2501, camera 2502, image reception part 2503, operation switch 2504, and display portion 2505. The present invention can be used as the display portion 2505.

If the luminescence brightness of the EL material is enhanced in the future, the present invention will be applicable to a front or rear type projector.

The present invention has a quite wide scope of application, as mentioned above, and is applicable to electronic equipment in all fields. The electronic equipment of this embodiment can be realized by the using any structure resulting from the free combination of embodiments 1 to 10.

In accordance with the above structures, it becomes possible to store a digital data signal input to a pixel in a write-in period until the completion of a display period. In other words, it is possible for an electric charge stored in a gate electrode of an EL driver TFT to be prevented from decreasing due to a leak current of a switching TFT, and it becomes possible to prevent a reduction in the brightness of light emitted by an EL element.

Further, it is possible to form a volatile memory using a TFT, and therefore it is possible to form the volatile memory at the same time as the switching TFT and the EL driver TFT.

Note that a storage capacitor need not be actively formed in the present invention. If the storage capacitor is not formed, it becomes possible to shorten the amount of time for inputting a digital data signal to pixels. Therefore, even if there is an increase in the number of EL display pixels, the length of a write-in period can be controlled in a time partitioned gradation digital driver. Consequently, a subframe period can be shortened by a certain extent, and the number of image gradations can be increased.

What is claimed is:

1. A display device comprising:
   a first pixel comprising a first switching TFT, a first SRAM, a first EL driver TFT, and a first EL element wherein the first switching TFT is electrically connected to the first EL driver TFT through the first SRAM;
   a second pixel adjacent to said first pixel, said second pixel comprising a second switching TFT, a second SRAM, a second EL driver TFT and a second EL element wherein the second switching TFT is electrically connected to the second EL driver TFT through the second SRAM;

a gate signal line electrically connected to a gate electrode of the first switching TFT and a gate electrode of the second TFT;

a first source signal line and a second source signal line, each extending across said gate signal line wherein one of a source region or a drain region of the first switching TFT is connected to the first source signal line and one of a source region or a drain region of the second switching TFT is connected to the second source signal line;

an electric power supply line extending across said gate signal line wherein said electric power supply line is located between said first signal line and said second signal line and is commonly connected to said first and second EL driver TFTs, wherein the first SRAM stores a digital data signal input to the first SRAM from the first source signal line through the first switching TFT, until the next digital data signal is input to the first SRAM, wherein at least one of said first and second SRAM comprises two p-channel TFTs, an n-channel TFT, and a resistor, source regions of the two p-channel TFTs are each connected to the high voltage side electric power supply, a drain region of one p-channel TFT is connected to a drain region of the n-channel TFT, and a drain region of the other p-channel TFT is connected to the low voltage side electric power supply through the resistor, and a source region of the n-channel TFT is connected to the low voltage side electric power supply.

2. A display device comprising:

a first pixel comprising a first switching TFT, a first SRAM, a first EL driver TFT, and a first EL element wherein the first switching TFT is electrically connected to the first EL driver TFT through the first SRAM;

a second pixel comprising a second switching TFT, a second SRAM, a second EL driver TFT and a second EL element wherein the second switching TFT is electrically connected to the second EL driver TFT through the second SRAM;

a gate signal line electrically connected to a gate electrode of the first switching TFT and a gate electrode of the second TFT;

a first source signal line and a second source signal line, each extending across said gate signal line wherein one of a source region or a drain region of the first switching TFT is connected to the first source signal line and one of a source region or a drain region of the second switching TFT is connected to the second source signal line;

an electric power supply line extending across said gate signal line wherein said electric power supply line is located between said first signal line and said second signal line and is commonly connected to said first and second EL driver TFTs, wherein a period within one frame period during which at least the first and second EL elements emits light is controlled by using a digital data signal wherein the first SRAM stores the digital data signal input to the first SRAM from the first source signal line, through the first switching TFT, until the next digital data signal is input to the first SRAM, and wherein at least one of said first and second SRAM comprises two p-channel TFTs, an n-channel TFT and a resistor, source regions of the two p-channel TFTs are each connected to the high voltage side electric power supply, a drain region of one p-channel TFT is connected to a drain region of the n-channel TFT, and a drain region of the other p-channel TFT is connected to the low voltage side electric power supply through the resistor, and a source region of the n-channel TFT is connected to the low voltage side electric power supply.

3. A display device comprising:

a first pixel comprising a first switching TFT, a first SRAM, a first EL driver TFT, and a first EL element wherein the first switching TFT is electrically connected to the first EL driver TFT through the first SRAM;

a second pixel adjacent to said first pixel, said second pixel comprising a second switching TFT, a second SRAM, a second EL driver TFT and a second EL element wherein the second switching TFT is electrically connected to the second EL driver TFT through the second SRAM;

a gate signal line electrically connected to a gate electrode of the first switching TFT and a gate electrode of the second TFT;

a first source signal line and a second source signal line, each extending across said gate signal line wherein one of a source region or a drain region of the first switching TFT is connected to the first source signal line and one of a source region or a drain region of the second switching TFT is connected to the second source signal line;

an electric power supply line extending across said gate signal line wherein said electric power supply line is located between said first signal line and said second signal line and is commonly connected to said first and second EL driver TFTs, wherein one frame period is divided into n sub-frame periods SF1, SF2, . . . , SFn;

the n sub-frame periods SF1, SF, . . . , SFn have write-in periods Ta1, Ta2, . . . , Tan, and display periods Ts1, Ts2, . . . , Tsn, respectively;

a digital data signal is input to at least one of first and second pixels during the write-in periods Ta1, Ta2, . . . , Tan;

whether one of the first and second EL elements emits light or does not emit light during the display periods Ts1, Ts2, . . . , Tsn is selected in accordance with the digital data signal;

a ratio of the length of the display periods Ts1, Ts2, . . . , Tsn is expressed by $2^0 : 2^{-1} : \ldots : 2^{-(n-1)}$; and the first SRAM stores a digital data signal input to the first SRAM from one of the first source signal lines, through the first switching TFT, until the next digital data signal is input to the first SRAM, wherein at least one of said first and second SRAM comprises two n-channel TFTs a p-channel TFT, and a resistor source regions of the two n-channel TFTs are each connected to the low voltage side electric power supply, a drain region of one n-channel TFT is connected to a drain region of the p-channel TFT, and a drain region of the other n-channel TFT is connected to the high voltage side electric power supply through the resistor, and a source region of the p-channel TFT is connected to the high voltage side electric power supply.

4. A display device according to any one of claims 1 to 3, wherein:

each of the first and second EL elements comprises an EL layer between the anode and the cathode; and the EL layer comprises a material selected from the group consisting of a low molecular weight organic material and an organic polymer material.

5. A display device according to claim 4, wherein the low molecular weight material is selected from the group consisting of Alq3 (tris-8-quinolinolate aluminum) and TPD (triphenylamine dielectric).

6. A display device according to claim 4, wherein the organic polymer material is selected from the group consisting of PPV (polyvinyl carbazole), and polycarbonate.

7. A display device according to claim 2 or 3, wherein the first frame period is equal to or less than 1/60 second.

8. A computer having the display device according to any one of claims 1 to 3.

9. A video camera having the display device according to any one of claims 1 to 3.

10. A DVD player having the display device according to any one of claims 1 to 3.

11. An electronic device having a display device, said display device comprising:

at least first and second source signal lines formed over a substrate;

at least one gate signal line extending in an orthogonal direction to said source signal lines over said substrate;

at least a first switching thin film transistor disposed at an intersection of said first source signal line and said gate signal line, wherein a gate electrode of said first switching thin film transistor is electrically connected to said gate signal line and one of source or drain of said first switching thin film transistor is electrically connected to said first source signal line;

a second switching thin film transistor disposed at an intersection of said second source signal line and said gate signal line, wherein a gate electrode of said second switching thin film transistor is electrically connected to said gate signal line and one of source or drain of said second switching thin film transistor is electrically connected to said second source signal line;

at least one power supply line formed over said substrate;

at least first and second EL driver thin film transistors formed over said substrate wherein said first and second EL driver thin film transistors are electrically connected to said power supply line;

an electroluminescence element electrically connected to a drain region of said first EL driver thin film transistor, wherein said display device further comprises a first SRAM electrically connected to said first switching thin film transistor and a second SRAM electrically connected to said second switching thin film transistor, wherein at least one of said first and second SRAM comprises two n-channel TFTs, a p-channel TFT, and a resistor, source regions of the two n-channel TFTs are each connected to the low voltage side electric power supply, a drain region of one n-channel TFT is connected to a drain region of the p-channel TFT, and a drain region of the other n-channel TFT is connected to the high voltage side electric power supply through the resistor, and a source region of the p-channel TFT is connected to the high voltage side electric power supply.

12. The electronic device according to claim 11 wherein the other one of the source or drain of the first switching thin film transistor is electrically connected to an input terminal of said first SRAM and a gate of said first EL driver thin film transistor is electrically connected to an output terminal if said first SRAM.

13. The electronic device according to claim 11 wherein said electric device is a personal computer.

14. The electronic device according to claim 11 wherein said electric device is a video camera.

15. The electronic device according to claim 11 wherein said electric device is a head mount display.

16. The electronic device according to claim 11 wherein said electric device is a picture reproducer.

17. The electronic device according to claim 11 wherein said electronic device is a portable information terminal.

* * * * *